United States Patent
Vora et al.

[11] Patent Number: 6,025,736
[45] Date of Patent: *Feb. 15, 2000

[54] FAST REPROGRAMMABLE LOGIC WITH ACTIVE LINKS BETWEEN CELLS

[75] Inventors: Madhukar Vora, Los Gatos; Burnell G. West, Fremont, both of Calif.

[73] Assignee: Dynalogic, Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/869,201

[22] Filed: Jun. 4, 1997

Related U.S. Application Data

[60] Continuation-in-part of application No. 08/639,272, Apr. 23, 1996, Pat. No. 5,668,495, which is a division of application No. 08/375,303, Jan. 20, 1995, Pat. No. 5,570,059, which is a continuation of application No. 08/274,817, Jul. 14, 1994, Pat. No. 5,406,133, which is a division of application No. 08/002,172, Jan. 8, 1993, Pat. No. 5,355,035.

[51] Int. Cl.$^7$ ............................................. H03K 19/177
[52] U.S. Cl. .................................. 326/39; 326/41; 326/44
[58] Field of Search ................................. 326/38, 39, 40, 326/41, 44

[56] References Cited

U.S. PATENT DOCUMENTS

| | | | |
|---|---|---|---|
| 5,426,383 | 6/1995 | Kumar | 326/119 |
| 5,497,108 | 3/1996 | Menon et al. | 326/39 |
| 5,504,440 | 4/1996 | Sasaki | 326/39 |
| 5,512,765 | 4/1996 | Gaverick | 257/202 |
| 5,543,640 | 8/1996 | Sutherland et al. | 257/202 |
| 5,552,721 | 9/1996 | Gould | 326/39 |
| 5,614,844 | 3/1997 | Sasaki et al. | 326/84 |
| 5,631,578 | 5/1997 | Clinton et al. | 326/41 |
| 5,654,665 | 8/1997 | Menon et al. | 327/541 |
| 5,671,432 | 9/1997 | Bertolet et al. | 395/800 |
| 5,692,147 | 11/1997 | Larsen et al. | 395/412 |

OTHER PUBLICATIONS

Mark Horenstein, Microelectronic Circuits & Devices, Prentice–Hall, Inc, pp. 753–755, 1990.

*Primary Examiner*—Michael Tokar
*Assistant Examiner*—Daniel D. Chang
*Attorney, Agent, or Firm*—Ronald C. Fish; Falk & Fish

[57] ABSTRACT

A high speed active link switching technology suitable for implementing field programmable gate arrays using current mode logic in the high speed data path, and CMOS steering logic outside the high speed data path to enable the high speed switching logic and to implement multiplexer, selector and crossbar switch functions. High speed emitter follower logic compatible with the high speed switching logic for level shifting, buffering, and providing more current sink or source capacity is also disclosed. An advantage of the active link technology disclosed herein is that the active links do not degrade rise and fall times of high speed data signals nearly as much as the passive links of prior art field programmable gate arrays thereby enabling use of FPGAs in higher speed applications than was previously possible.

17 Claims, 10 Drawing Sheets

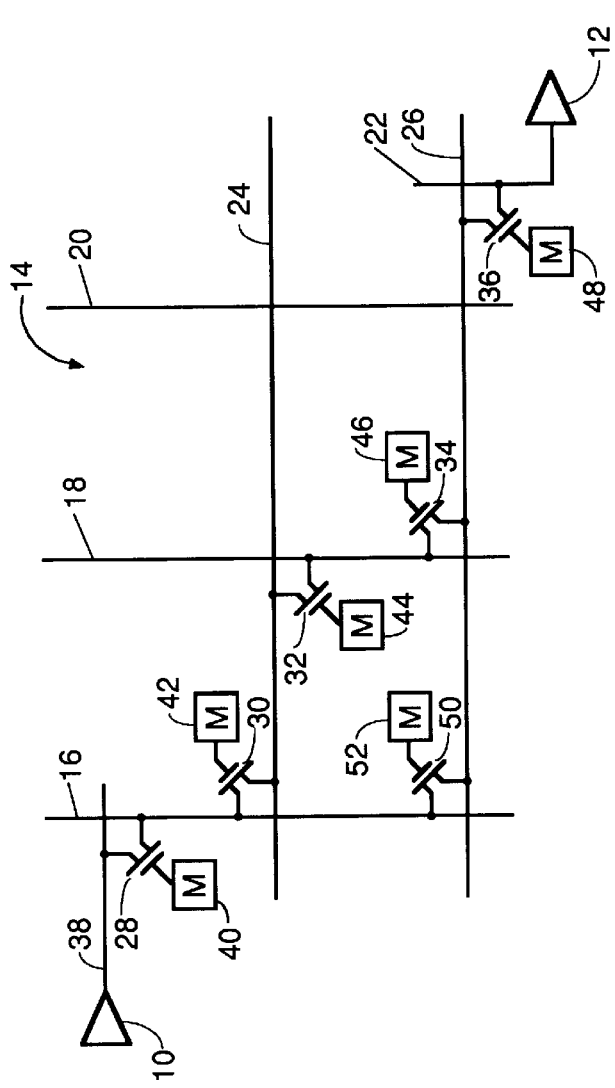
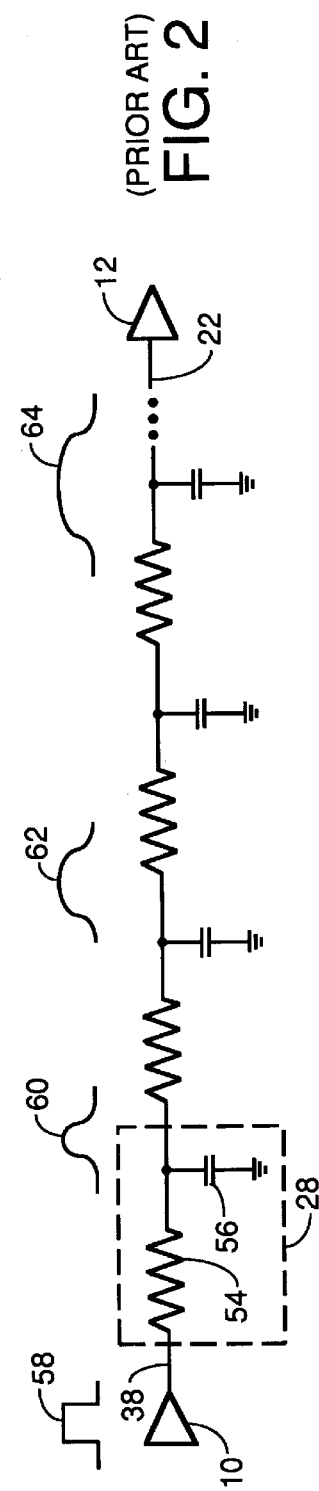

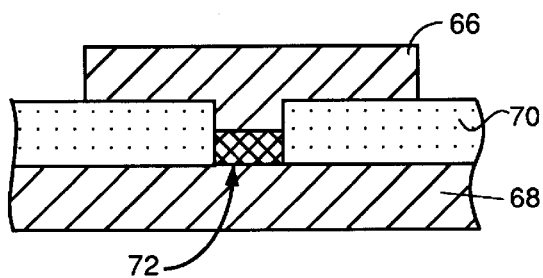
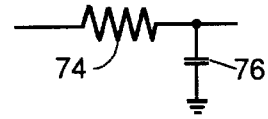
FIG. 3
(PRIOR ART)
FIG. 4
(PRIOR ART)
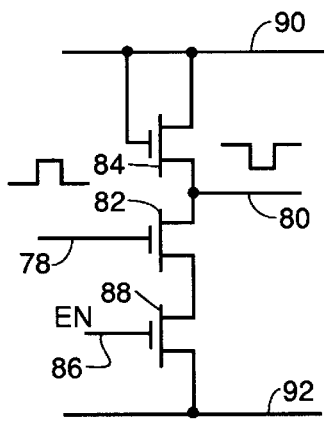
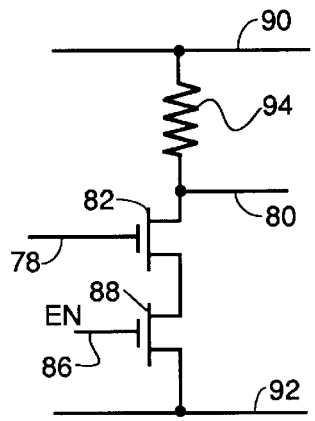
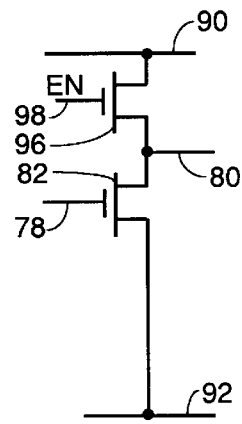
FIG. 6A
FIG. 6B
FIG. 6C
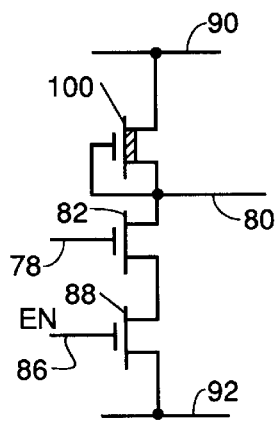
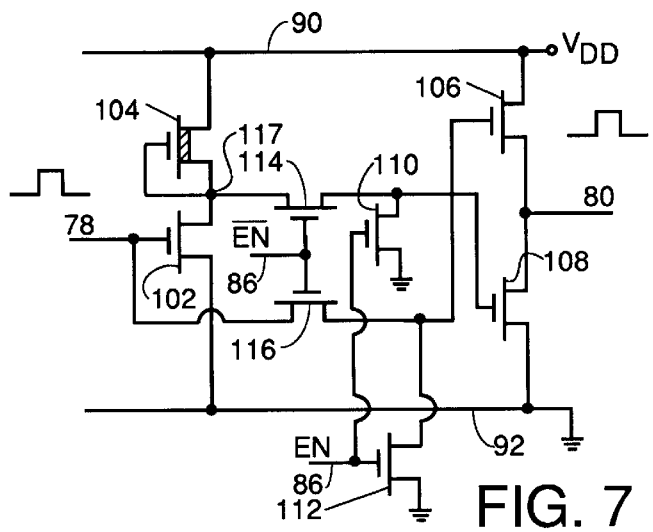
FIG. 6D
FIG. 7 ized by reference and cited
FAST REPROGRAMMABLE LOGIC WITH ACTIVE LINKS BETWEEN CELLS This is a continuation-in-part of prior U.S. patent application entitled BICMOS REPROGRAMMABLE LOGIC, Ser. No. 08/639,272, filed Apr. 23, 1996, now U.S. Pat. No. 5,668,495 (Atty Dkt DYN-001.2D), which was a divisional of a U.S. patent application of the same title, Ser. No. 08/375,303, filed Jan. 20, 1995, now U.S. Pat. No. 5,570,059, issued Oct. 29, 1996 (Atty Dkt DYN-001.1C), which was a continuation of a U.S. patent application of the same title, Ser. No. 08/274,817, filed Jul. 14, 1994, now U.S. Pat. No. 5,406,133, issued Apr. 11, 1995 (Atty Dkt DYN-001.1D), which was a divisional of a U.S. patent application of the same title, Ser. No. 08/002,172, filed Jan. 8, 1993, now U.S. Pat. No. 5,355,035, issued Oct. 11, 1994 (Atty Dkt DYN-001). The prior art cited by applicants to the U.S. Patent and Trademark Office and prior art cited by the U.S. Patent and Trademark Office to the applicants in all of these parent cases is hereby incorporated by reference and cited hereby to the U.S. Patent and Trademark Office.

BACKGROUND OF THE INVENTION

The invention pertains to the field of custom circuits, and, more particularly, to the field of components and cells from which field reprogrammable logic circuits may be constructed and field programmable logic circuits themselves.

Logic designers have long had the need for custom logic circuits to implement their designs. In the 1970's, this need gave rise to programmable logic arrays, programmable array logic and programmable read only memory. Later in the decade, custom circuits were made by customizing the metal layer of integrated circuits which had standard cells formed in the layers below the metal layer. The customized metal layer interconnected the standard cells in a manner defined by the customer of the gate array manufacturer.

Gate arrays are only a good choice where the desired function to be performed by the gate array can be determined with certainty in advance. However, gate arrays are not a good choice where the desired function can change over time with changing requirements. This can happen when a circuit design is being evaluated and testing over time reveals the need for changes in the design. Another shortcoming of gate arrays was that they could not perform the function of packet encapsulation and delivery in network settings where packet construction was subject to a variety of different protocols and where packet headers change as the packets circulate, for example in token ring networks. This function has been done in software in the prior art, but increasing network speeds demands more speed which requires that this function be done in hardware.

Another application in which fixed gate arrays had shortcomings in where data flow paths change over time as a function of changes in the process that is being emulated by a particular circuit. Thus, a need arose for more flexibility in custom circuits such that the functions thereof can be changed.

Reprogrammable gate arrays, also called field programmable gate arrays or FPGAs, were developed in response to this need. However, these gate arrays were implemented in CMOS technology. Although CMOS has significant advantages such as low power, high circuit density, good reliability and low cost, CMOS is not fast enough for very high speed custom circuits needed in applications such as supercomputers, communication systems, high speed workstations, networks, automatic test equipment, parallel processor interconnects and design emulation systems. In very fast applications such as these, having any MOS device in the signal path seriously impedes the switching speed and impairs the performance of the machine. This is because the resistivity of CMOS and MOS devices is too high, and this coupled with the junction capacitances and other capacitances intrinsic to MOS devices causes delays.

Typical prior art field programmable gate arrays use passive programmable links to couple signals between standard cells of the gate array. Typically, a matrix of programmable connections make connections on the chip between various standard cells thereby defining the functionality of the chip. Prior art FPGAs made by Xilinx, Altera and Actel used passive devices which are programmed to make the connections between ports on the various standard cells to be coupled together. These passive connections defined a crossbar switch wherein any line could be connected to any other line through the passive programmable connectors to connect the standard cells together in the desired manner. Because these connections were made through these passive, programmable connectors, the high speed data propagating between standard cells was subjected to the parasitic series resistance and shunt capacitance of the passive connectors. These parasitic components formed RC low pass filters, which, because they were coupled to the high speed signal paths, slowed down the operation of the FPGA. Specifically, the RC low pass filters caused loss to the substrate of high frequency components in the Fourier spectrum of the high speed data. This loss caused sharp edges in the high speed data signals to be rounded and slowed pulse rise times thereby slowing the overall operation of the circuit.

All passive connections suffer this same infirmity because they are not able to replace any energy lost in the parasitics.

Accordingly, the need has arisen for a much faster technology that can be substituted for field programmable gate array circuits in extremely high speed applications using active links to couple different circuit elements together in a programmable fashion.

SUMMARY OF THE INVENTION

According to the teachings of the invention, reprogrammable logic circuitry such as an FPGA is implemented with high speed gates coupled together in a programmable fashion by an array of active links. The active links are capable of applying gain to high speed data signals passing therethrough sufficient to replace at least some of the energy lost to parasitics so as to improve the performance of a FPGA using the teachings of the invention over FPGAs using passive links. An active link is capable of replacing lost energy caused by parasitic components coupled to the high speed data and substantially preserves the pulse shape and rise times of the high speed data. Through use of active links according to the teachings of the invention, the high speed data waveform rise times and fall times of high speed data propagating from one gate to another through a series of active links do not deteriorate as much as the rise or fall times of these same signals deteriorate when propagating through an equal number of prior art passive links. Passive links, as that term is used in the claims, means a programmable link or switching connection in a prior art gate array which has a gain less than one and which does not replace any energy lost from signals propagating therethrough either by shunting to the substrate through parasitic capacitance or dissipated in parasitic series resistance. This improves the operating speed of any FPGA using the teachings of the invention.

In the simplest embodiments, the active links are CMOS NAND gates like the gate shown in FIG. 10 or NMOS (or PMOS) inverters or NMOS (or PMOS) inverters with drivers such as are shown in FIGS. 6A through 6D. In other embodiments, the active links can use the biCMOS differential pair selector of FIGS. 11 or 13, the biCMOS differential pair multiplexors of FIGS. 14 or 15, the biCMOS differential pair crossbar switch of FIG. 16, the biCMOS emitter follower of FIG. 17 or the biCMOS singled ended switch of FIG. 18, or other switching circuits such as Schottky Gate FETS implemented in gallium arsenide which are capable of applying enough gain to replace energy lost to parasitics so as to not substantially degrade rise times or fall times of high speed data signals.

In a typical embodiment of the invention, high speed standard cells are located at various locations on the FPGA and are connected in a programmable fashion using the active links and data stored in memory cells on the integrated circuit. The preferred form of active links shown in FIG. 11 and FIGS. 13 through 18 use high speed bipolar integrated devices such as ECL circuitry in the data path with CMOS devices doing the function of enabling or disabling one or more of the high speed bipolar devices to make the connections between standard cells necessary to implement the desired function of the FPGA. The CMOS devices in the active links are generally kept out of the high speed data path and only are used to program the selection of which input signals are coupled to which outputs through the high speed devices. In the preferred embodiment, the high speed devices of the active links are ECL technology devices enabled by CMOS devices, but in other embodiments, they may be single ended bipolar devices activated by CMOS devices or all NMOS or all PMOS devices can be used for the enabling circuitry with suitable adjustments of the sense of the enabling signals.

It is only important in the preferred active link embodiments that the MOS devices be coupled to the high speed switching devices to selectively enable or disable them. In the preferred embodiment, this is done by using one MOS device to selectively connect a current source sinking current from a bipolar device emitter or common emitter node to the low voltage rail if the bipolar device(s) are to be enabled or disconnect the current source from the low voltage rail if the bipolar devices are to be disabled. Simultaneously, another MOS device is used to selectively alter the base-emitter bias across the base-emitter junctions of the differential bipolar pair or across the base-emitter junction of the single ended bipolar device to cut off current from the collector to the emitter if the switch is to be disabled or allow current flow if the device is to be enabled.

Further, the active links can use any high speed technologies such as gallium arsenide switching technologies instead of the single ended or differential bipolar switches.

The active links can be any active device or circuit which is capable of gain of close to 1 or greater such that the shape and rise times of the incoming high speed data waveforms can be substantially maintained as they pass through each active link or a series thereof.

Typically, in the prior art passive links, a 10 nanosecond pulse width high speed data signal will be degraded by losses of high frequency energy in passing through 10 passive links so as to have a 30 nanosecond pulse width after the 10th link. This increase in pulse width is caused by spreading out of the pulse as the sharp rise and fall times at the pulse edges are rounded off and stretched off under the influence of the parasitic components as the signal propagates through a plurality of the passive links. The series parasitic resistance and shunt parasitic capacitance causes RC time delays which slow rapid signal transitions—in effect, the RC combination is a low pass filter which dissipates energy and shunt high frequency components to ground.

In contrast, the active links contemplated by the invention are any active devices that can substantially improve on the prior art performance in terms of degradation of pulse width and rise and fall times times of signals propagating therethrough. Depending upon the type of active link, the type of semiconductor substrate used etc., typical pulse width degradation occurring during propagation through 10 active links according to the teachings of the invention will be 2 nanoseconds, i.e., a 10 nanosecond pulse width at the beginning of the chain will be approximately a 12 nanosecond pulse width at the end of the chain.

In one embodiment of an active link according to the teachings of the invention, a high speed selector is implemented in differential current mode logic with CMOS steering transistors to enable the high speed switching transistors. The CMOS steering transistors are out of the high speed data path. More specifically, this embodiment uses a pair of differentially coupled ECL transistors for each of a plurality of output pairs of high speed, complementary data output signals. Each of these pairs of ECL switching transistors have bases which are coupled to a shared pair of inputs for receiving a pair of high speed, complementary data inputs. Each of these pairs of ECL switching transistors also shares a common emitter node coupled selectively to the low voltage supply by a constant current source and an NMOS transistor which is part of the enabling mechanism. This enabling transistor is out of the high speed data path, and receives a steering signal in the form of a data bit from a static memory cell which, in one state, turns the NMOS transistor on and couples the constant current source to the low voltage supply thereby enabling the switching transistors. The other state of the steering signal turns the NMOS transistor off thereby disconnecting the constant current source from the low voltage supply and disabling the switching transistors. The other part of the enabling mechanism is a PMOS transistor which is coupled to the steering signal and selectively couples the common emitter node to the high voltage supply. When the NMOS transistor is on, the PMOS transistor is off thereby allowing the ECL transistors to operate in differential mode. When the NMOS transistor is off, the PMOS transistor is on and lifts the common emitter node to the voltage of the high voltage supply thereby turning the ECL transistors off by reverse biasing their base-emitter junctions.

In another embodiment of an active link according to the teachings of the invention, a multiple-input, single-output multiplexer is disclosed. The basic ECL switching cell used in this multiplexer is the same except that one differentially coupled ECL pair is coupled to one pair of high speed data inputs and the shared pair of high speed differential outputs, and is coupled to the high voltage supply through a pair of pull up resistors. All other differential pairs coupled to high speed data input pairs are coupled to the same shared pair of high speed data outputs and share the single set of pullup resistors. Each differential pair of ECL transistors has its own constant current source and its own enabling circuitry and has a dedicated steering signal coupled to the corresponding enabling circuit. The enabling circuitry is identical to the enabling circuitry described for the selector and works the same way and has the same attributes.

In another embodiment of the active links according to the teachings of the invention a multiple-input, multiple-output crossbar switch can be implemented using the multiple-input, single-output multiplexer described above. The gates or standard cells of the FPGA to be coupled together are coupled to the input lines and output lines of the crossbar switch. By suitably programming the enable signals, coupled to the CMOS steering transistors, the proper connections are made in the crossbar switch to couple the standard cells together in a way such that the desired functionality of the FPGA is achieved. In this embodiment, a first series of high speed data input pairs are coupled to a series of differentially coupled ECL switches linked together to share a common high speed data output port in the manner just described for the multiplexer. Another series of high speed, differentially coupled ECL switches are coupled together so as to share a second high speed, complementary data output port. This second data output port is common only to this second series of ECL switch pairs as described above for the multiplexer structure. This second series of ECL switch pairs is then coupled so as to share the same high speed, complementary data inputs used by the first series of differentially coupled ECL switches. This structure can be repeated for a large number of series of such multiplexers sharing the same input signals to extend the number of outputs in the crossbar switch. The upper limit of this extension is more a function of how much degradation of the switching speed is tolerable under the circumstances. This switching speed degradation is a function of the number of ECL switching pairs which load each high speed data input.

Another embodiment for an active link according to the teachings of the invention is a high speed emitter follower structure. This structure can also be used in conjunction with the foregoing structures for level shifting, output buffering, increasing output current source or sink capacity or in a stand-alone mode to implement another form of a cross-bar switch. In this embodiment, a bipolar transistor is coupled as an emitter follower to a constant current source. The high speed data input is selectively coupled to the base of the emitter follower through a PMOS transistor which is part of the enabling circuitry. The constant current source is coupled to the low voltage supply selectively through an NMOS transistor which also is part of the enabling circuitry. Another NMOS transistor selectively couples the base of the emitter follower transistor to the low voltage supply. Multiple structures or "cells" like the structure just described can be used, with each such cell being coupled to one high speed data input and one high speed data output. Each cell receives two complementary steering signals which enable or disable it. When the steering signals are in a state to enable the cell, the first NMOS transistor coupled to the first steering signal couples the constant current source to the low voltage supply, and the second NMOS transistor coupled to the second steering signal decouples the base of the emitter follower from the low voltage supply. The PMOS transistor in the enabling circuitry coupled to the second steering signal, then couples the high speed data input to the base of the emitter follower. In the second, complementary state of the steering signals, the base of the emitter follower is decoupled from the high speed data input and coupled to the low voltage supply to reverse bias the base-emitter junction. Simultaneously, the constant current source is decoupled from the low voltage supply thereby disabling the emitter follower further. Multiple such cells coupled to multiple inputs and outputs can be used to implement selectors, multiplexers or crossbar switches for use in coupling the standard cells of the FPGA together.

Generally, current mode logic is preferred for the switching technology of the active links because of its speed, and CMOS technology is preferred for the enabling switches because of its small size and low power consumption. Low power consumption is important especially in integrated ECL switching embodiments, because the ECL transistors dissipate large amounts of power, and this power must be dissipated. This can be a problem for highly dense integrated structures. If the power is not properly dissipated and the temperature of the chip kept under control, thermal runaway problems and temperature compensation problems become a factor to be dealt with thereby complicating the design and increasing the expense and complexity thereof. Further, yield for integrated circuit production decreases when die size is increased which occurs when either more transistors are added or when the same number of transistors are implemented in technologies which are larger per transistor in terms of chip real estate consumed. Since every ECL pair and every emitter follower needs two or more enabling transistors, effectively doubling or tripling the density per switching function, it is especially useful to implement the enabling function in CMOS so as to not aggravate the power dissipation problem. Further, since MOS transistors are smaller than corresponding bipolar transistors, implementing the enabling function in CMOS uses less area and allows more switching functions to be put on the same die or allows the same number of switching functions to be put on a smaller die.

However, where chip real estate, switching speed or power consumption are not issues, bipolar or other switching enabling technology can be used to enable the switches in the high speed data path. Also, other types of architectures or other slower, cheaper, smaller or otherwise different technologies may be used for the switches in the high speed data path.

An advantage of the active links over prior art antifuse type passive links such as those made by Actel is that antifuse passive links do not scale easily or at all to the ever decreasing line widths of modem semiconductor processing. Although the antifuse structure itself may be made smaller, it still takes a high voltage of about 10 volts to cause a punch through of an antifuse structure to cause it to make a connection between two different conductors. The problem with putting a 10 volt programming signal on a line running through a chip have 0.35 micron design rules is that other devices may be destroyed. This is because the other structures on the device have dimensions that are too small to be able to withstand voltages over 3 volts. This makes it difficult or impossible to build antifuse FPGAs which are very dense using the currently available tighter design rules. Circuits with linewidths of 0.25 microns can only withstand a maximum of 2 volts.

There is a limitation on the mix and match of active links between standard cells and the active links used to connect them. Generally speaking, this means that the logic levels of the standard cell must be generally the same as the logic levels in the active links. For example, when the standard cells are ECL, then active links used to connect these types of cells must use ECL logic levels. The particular structure of the active link is not critical and it may contain some CMOS transistors as long as the logic levels are ECL levels. Likewise, CMOS or MOS standard cell circuits are connected by active links using CMOS or MOS logic levels.

BRIEF DESCRIPTION OF THE DRAWINGS

FIG. 1 is diagram illustrating a typical prior art FPGA with passive link structure in the form of an MOS pass transistors.

FIG. 2 is an equivalent circuit showing the parasitic components of the prior art structure of FIG. 1.

FIG. 3 is a cross section of a typical prior art antifuse structure. FIG. 4 is an equivalent circuit showing the parasitic elements of the prior art antifuse structure of FIG. 3.

FIG. 6A is a circuit diagram of a typical NMOS inverter active link using a saturated MOS transistor for a load resistance.

FIG. 6B is a circuit diagram of a typical NMOS inverter active link using a passive resistor for a load resistance.

FIG. 6C is a circuit diagram of a typical NMOS inverter active link using a nonsaturated MOS transistor operating in the triode region for a load resistance.

FIG. 6D is a circuit diagram of a typical NMOS inverter active link using a depletion mode MOS transistor for a load resistance.

FIG. 7 is a circuit diagram for an active link in the form of an NMOS inverter having push-pull outputs and a tristate circuitry to improve the isolation between the lines to be connected.

DETAILED DESCRIPTION OF THE PREFERRED EMBODIMENT

Figure 5:
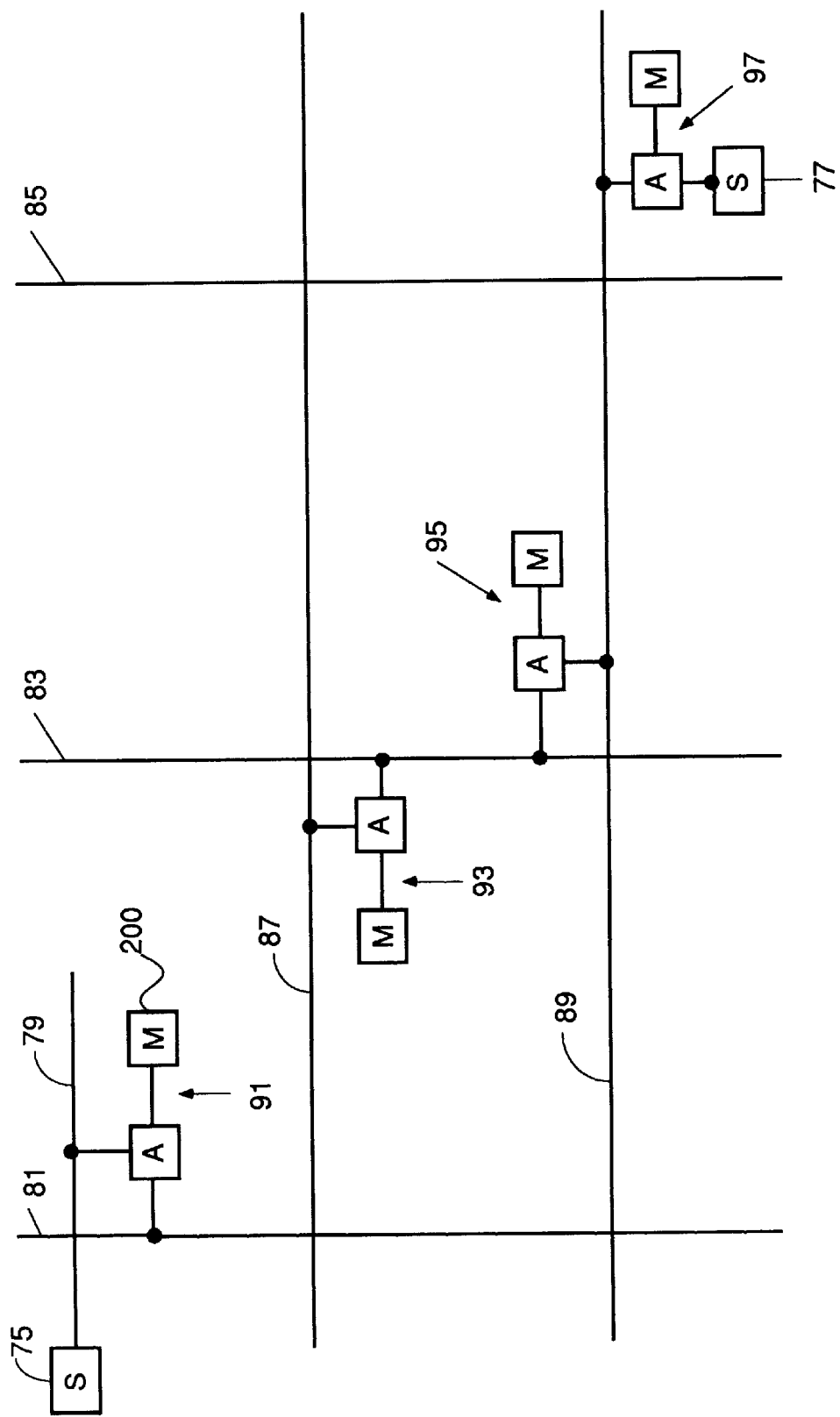
FIG. 5 is diagram illustrating a symbolic structure for a field programmable gate array using the active link technology disclosed herein.

Referring to FIG. 1, there is shown a diagram of a typical field programmable gate array of the type using prior art passive links in the form of pass transistors such as is typically found in Xilinx FPGAs. To implement a desired function in this prior art FPGA, the output of a first standard cell 10 needs to be coupled to the input of a second standard cell 12. The FPGA integrated circuit has a matrix 14 of intersecting conductors on different layers which are insulated from each other. The conductors on one layer are symbolized by the vertical lines 16, 18, 20 and 22, while the conductors on another layer are symbolized by horizontal lines 24 and 26. To make the desired connection, 5 passive MOS "pass" transistors 28, 30, 32, 34 and 36 are programmed to make connections between various of the conductors in matrix 14. Pass transistor 28 is programmed to make a connection between the output 38 of standard cell 10 and matrix conductor 16. This is done by programming a logic 1 (or logic 0 depending upon the type of MOS transistor technology used for the pass transistors and logic levels) into memory cell 40.

Likewise, pass transistor 30 is programmed to make a connection between lines 16 and 24 by programming a logic 1 into memory cell 42. Pass transistor 32 is programmed to make a connection between lines 24 and 18 by programming a logic 1 into memory cell 44, and pass transistor 34 is programmed to make a connection between lines 18 and 26 by programming a logic 1 into memory cell 46. Finally, pass transistor 36 is programmed to make a connection between line 26 and the input 22 to standard cell 12 by programming a logic 1 into memory cell 48.

Because pass transistor 50 is not needed to make the connection between standard cell 10 and standard cell 12, it's memory cell 52 is programmed with a logic 0 so that no connection is made between line 16 and line 26 (unless this connection is needed as part of another conductive path between two different standard cells.

Memory cell 40, like all the other memory cells symbolized by an M in a box on the drawing, is typically a 6 transistor CMOS static RAM cell, and usually is part of a shift register (not shown) which snakes through the integrated circuit layout. This shift register contains the programming bits needed to control each pass transistor as well as any enable transistors in the standard cells. In alternative embodiments, the memory cells such as memory cell 40 can be stand alone memory cells coupled by shared data, address and control lines that go to each cell or memory cells grouped into a memory array having shared data input, address and control lines and coupled to the individual pass transistors by individual data output lines. the first layer The arrangement shown in FIG. 1 has disadvantages in that it slows down operation of the FPGA. The reason for this can be understood by reference to FIG. 2 which is an equivalent circuit for the electrical path between the output line 38 of standard cell 10 and the input line 22 of standard cell 12. The resistor and capacitor inside dashed line 28 represent the parasitic components of pass transistor 28 which affect propagation on the line. The resistor 54 represents the channel resistance of the pass transistor 28, and is typically 1000 ohms. The capacitor 56 represents the parallel summation of the parasitic gate-to-source, gate-to-drain, gate-to-substrate and line-to-substrate capacitances of the lines to and from each pass transistor source, drain and gate terminal. The combination of series resistor 54 and shunt capacitor 56 represent a low pass RC filter that shunts high frequency components of the high speed data signal to the substrate and causes delay in the rise times of fast pulses in accordance with the RC time constant of the filter.

Loss of high frequency components caused by these RC low pass filters, and the RC delay factor tends to soften the edges of rectangular pulses and spread them out. This decreases the slope of the edges of high speed rectangular pulses thereby increasing rise times. For example, consider high speed data input pulse 58 which will be assumed to be 10 nanoseconds in width. The pulse looks line pulse 60 after passing through the first low pass filter of pass transistor 28 and continues to degrade in both amplitude and pulse width as it propagates through each pass transistor, as represented by pulses 62 and 64.

Each MOS pass transistor such as transistors 28, 30, 32, 34, 36 and 50 operates in common gate mode. MOS devices operating in common gate mode exhibit no gain. Such passive devices are not coupled to any power supply so they supply no energy to replace the energy dissipated in the series resistance of the MOS device channel and the energy of the high frequency components siphoned off to the substrate through the parasitic shunt capacitances. This is the cause of the degradation of the amplitude and pulse width of the pulses 62 and 64.

Other FPGA companies use different forms of passive links called antifuse technology. A typical antifuse structure cross-sectional diagram is shown in FIG. 3. In an antifuse FPGA structure, a first plurality of conductors are formed on a first conductive layer, one line of which is represented by metal layer 66. A second plurality of conductors are formed on a second conductive layer which is insulated from the first conductive layer. This second plurality of lines is represented by metal layer 68. At the intersection of each line on the first layer with a line of the second layer, an antifuse structure like that shown in FIG. 3 is formed. In each antifuse structure, the two conductive layers 66 and 68 are separated from each other by an insulating layer 70 which is typically polysilicon. The polysilicon layer has a gap etched through it to form a via from the metal layer 66 to the metal layer 68. Metal from layer 66 fills in this via. The via has a layer of nitride 72 formed therein to separate and insulate the metal of layer 66 from the metal of layer 68.

To make a connection between metal line 66 and metal line 68, a 10 volt programming signal is applied to metal line 66 relative to metal line 68. This voltage exceeds the breakdown voltage of the nitride layer 72 and causes punch through by arcing wherein molten metal from layer 66 fills a hole in nitride layer 72 caused by the arc and makes electrical contact with metal layer 68. This punch through metal has a parasitic series resistance associated with it and the lines themselves have parasitic capacitance to the substrate.

The equivalent circuit for the structure of FIG. 3 is as shown in FIG. 4. Again, the equivalent circuit is comprised of a series resistance 74, which is typically 300 ohms, and a shunt capacitance 76 which is comprised of the parallel combination of the parasitic capacitance of the fuse plus the parasitic capacitance of the lines to and from the fuse. This RC combination again defines a low pass filter which siphons off high frequency components of the high speed data to ground.

The antifuse technology suffers from the same deficiency of the passive MOS pass transistor in that the successive RC delay factors and loss of high frequency components to ground through the shunt parasitic capacitances rounds off the corners of high speed rectangular data pulses, spreads out the width of the pulses and increases the rise time.

Although the antifuse technology has less parasitic resistance and shunt capacitance than a passive, common gate MOS pass transistor, it also suffers from the additional infirmity of not being scalable down to today's extremely small design rules. When an antifuse FPGA structure is scaled down to today's 0.35 micron design rules, the structures on the FPGA get so small that they do not have sufficient breakdown voltage protection to withstand voltages greater than 3 volts. This means that application of a 10 volt programming voltage to a programming line can cause arcing and punch through at places where not arcing or punch through is intended thereby causing shorts or destroying devices or both.

Active devices such as MOS and bipolar transistors and other active devices are much more easily scalable than antifuse technology, so active devices capable of amplification are used for the switches of active links according to the teachings of the invention.

Referring to FIG. 5, there is shown a diagram of a FPGA according to the teachings of the invention using active link technology which is more readily scalable and which does not degrade the speed of the chip as much as passive links. In the symbolic example of FIG. 5, two standard cells, logic gates or other circuitry 75 and 77 need to have a conductive path formed therebetween in order to implement some function desired by the user. When the integrated FPGA circuit is manufactured, it is manufactured with a plurality of standard cells of various designs, a plurality of logic gates, registers, multiplexers, ALUs etc. thereon. The boilerplate circuits can be any collection of known circuits and some FPGA chips intended for use in a particular field may have a different collection of boilerplate circuits than other FPGA circuits intended for use in another field of use. In the claims, these standard "boilerplate" circuits are referred to as standard cells, logic gates or other circuitry.

The FPGA chip after manufacture also has formed thereon a connection matrix, crossbar switch or some other form or arrangement of conductors and active links which is coupled to the boilerplate circuits and which can be programmed to make the desired connections between the boilerplate circuits to implement the desired functionality. In FIG. 5, the connection matrix is represented by conductors 79, 81, 83, 85, 87 and 89 and the associated active links represented by boxes with the letter A inside them. The boxes with the letter M inside them represent memory cells in which are stored bits which define whether the particular active link presents a high impedance path between the circuit nodes between which is connected or a low impedance path. The term active link in the claims means both the switching circuit represented by the boxes with the letter A inside as well as the memory cell or other circuitry by which the switching circuitry is either turned off or turned on at the choice of the user to make the necessary connections to implement the desired functionality. Typically, the control signals needed to control the switching circuits of the active links are supplied by memory cells which are loaded with logic bits by means of a shift register (not shown) of which each memory cell typically is a part and which snakes throughout the FPGA chip. To program the FPGA to any particular functional configuration, this shift register is loaded with thousands of bits in a particular sequence so all the desired connections are made in the connection matrix.

The exact nature of the switching circuits of the active links can vary, but all the different embodiments for active link switching circuits share the common characteristic of having a gain of approximately one or more so as to not degrade the speed of operation of the FPGA when a signal traverses a long chain of active links. One way of looking at the active links is that they have the capability of replacing energy lost to the substrate through parasitics from the signal propagating through a long chain of active links. Of course, a competitor might conclude that if he makes an active link with a gain of 0.9, he could escape infringement while still enjoying a speed advantage over the prior art passive link FPGAs. The phrase "having a gain of approximately one or more" is not intended to limit the gain of an active link according to the teachings of the invention to exactly one or higher. Instead this phrase is intended to indicate that an active link according to the teachings of the invention will have sufficient gain to not seriously degrade the rise times of signals propagating of a long chain of, for example, 10 active links to the extent such rise times are degraded in propagating through a chain of, for example, 10 passive links of the prior art.

A connection matrix according to the teachings of the invention is characterized by a plurality of conductors which are electrically insulated from each other such as conductors 79, 81, 83, 85, 87 and 89 in FIG. 5. A plurality of programmable electrical connections between selectable combinations of these conductors is implemented using a plurality of active links. In the example of FIG. 5, a programmable, easily reconfigurable data path between standard cell 75 and standard cell 77 is implemented by properly programming active links 91, 93, 95 and 97. Active link 91 is programmed by writing an appropriate bit into its memory cell to causing the switching circuit to form a low impedance path between conductors 81 and 79. Likewise, active link 93 connects conductors 87 and 83 and active link 95 connects conductors 83 and 89 and active link 97 connects conductor 89 and standard cell 77.

A process for forming a field programmable gate array circuit similar to that shown in FIG. 5 comprises forming the boilerplate circuitry on the die using any integrated circuit fabrication process compatible with the technology in which the boilerplate circuits are to be implemented. Then a connection matrix of conductors is formed using the same process such that the conductors are electrically insulated from each other. Then a plurality of active links are formed at locations so as to be able to make programmable connections between at least some of the conductors in the matrix and between input and output nodes of the boilerplate circuits and at least some of the conductors of the connection matrix.

An important feature of the invention is therefore to guide signals along data paths of a field programmable gate array in such a manner so as to prevent degradation of the rise or fall times of the signal to the same degree as the degradation of these rise or fall times should the same signal propagate through a like number of passive links in a prior art field programmable gate array. This is done by applying sufficient gain at each active link to prevent degradation in the rise or fall times of the signal comparable to that which would occur if the same signal were to propagate through the same number of antifuse or common gate type MOS device passive links such as are found in the prior art field programmable gate arrays.

Figure 10:
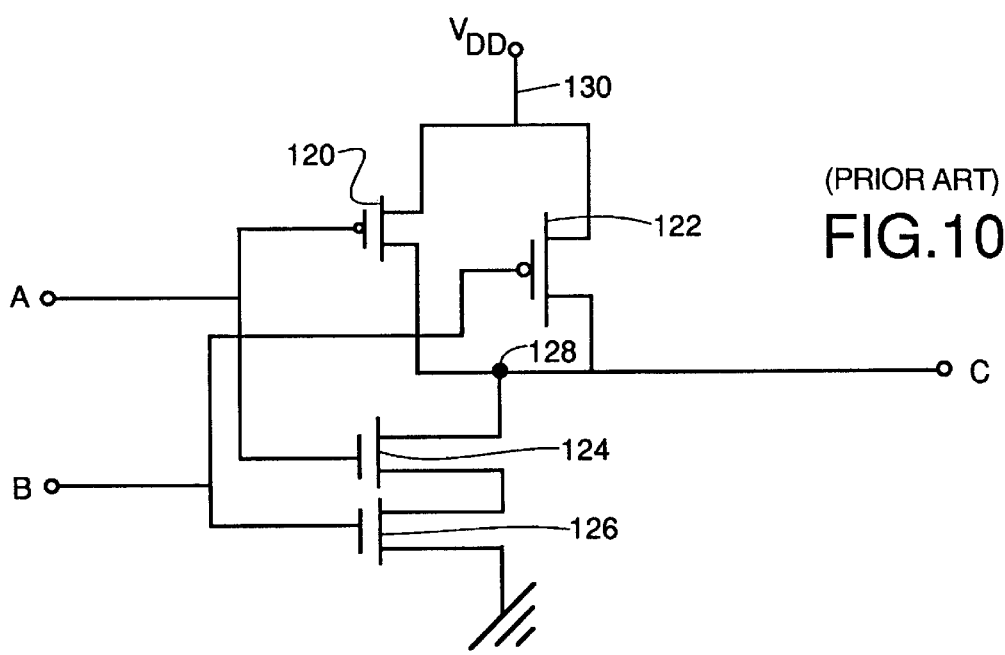
FIG. 10 is a circuit diagram of a CMOS implementation of a NAND gate.

FIGS. 6A through 6D are examples of MOS inverter circuits, and FIG. 10 is an example of a CMOS AND gate that could be used to implement the switching circuit of an active link according to the teachings of the invention. FIG. 7 is an example of an NMOS inverter with a push-pull output stage and tristate circuitry that also could be used to implement an active link according to the teachings of the invention. The examples of FIGS. 6A through 6D were taken from the treatise Ong, *Modern MOS Technology, Processes, Devices and Design*, Section 9-2, pp. 189–197 (McGraw Hill 1984) ISBN 0 07-047709-4, the entire contents of which is hereby incorporated by reference. In the particular example of FIG. 6A, an MOS inverter transistor 82 has as a load a saturated MOS device and is set up to apply a gain of approximately one or greater to the input signal. Lines 78 and 80 are the conductors in the connection matrix to be connected through the active link. The connection is programmably controlled by the logic level on an enable signal EN on line 86 coupled to the gate of enabling MOS transistor 88. The enable signal EN comes from the associated memory cell containing the programming bit or from another source of enable signals that defines the desired functionality of the chip. The high rail voltage defining a logic 1 level is on line 90, and the low rail voltage defining a logic 0 level is on line 92. Thus, even if the gain of the inverter is greater than one, the logic level of the signal output from a chain of such active links can never rise higher than the logic one level defined by the voltage on the high rail 90.

FIG. 6B is an example of an MOS inverter active link using a passive resistor load 94, and enabled by an enable signal EN on line 86 coupled to MOS device 88. All the considerations mentioned above with regard to the switching circuit of FIG. 6A apply equally to the switching circuits of FIGS. 6B, 6C and 6D, so only the differences in the switching circuits will be described below.

FIG. 6C is an example of an MOS inverter active link using a nonsaturated MOS device 96 for a load operating in the triode region. In this embodiment, the enable signal EN is a voltage higher than the high rail voltage on line 90 when the device is to be enabled so as to force MOS device 96 into the triode region. EN is low so as to cut off transistor 96 when the device is to be disabled. Any circuitry to convert the logic one level of the enable signal from the memory cell to the appropriate voltage to place the inverter in the triode region will suffice to practice this embodiment according to the teachings of the invention.

FIG. 6D is an example of an MOS inverter active link using a depletion mode MOS device 100 as a load. As is the case for the embodiments of FIGS. 6A, 6B and 6C, the inverter is enabled and disabled programmably by application of an enable signal EN on line 86 from an associated memory cell or other source to an MOS device 88. In one logic state of EN, the MOS device 88 couples the source of the transistor 82 to the low rail 92 to enable the device. In the other state of EN, transistor 88 is cutoff thereby disabling the device by decoupling the source of transistor 82 from the low rail.

All of the MOS inverter embodiments for active links in FIGS. 6A through 6D, when disabled, present a degree of isolation between the input line 78 and the output line 80 which may be sufficient in some applications and insufficient in others. When the inverters are disabled, the input line 78 is coupled to the output line 80 by the gate-to-drain parasitic capacitance of the inverter transistor 82. This small capacitance should provide sufficient isolation for all but the highest frequency data signals. However, high speed data signals having a frequency so high that inadequate isolation is provided by this gate-to-drain parasitic capacitance are not likely to be used with the MOS inverter active links shown in FIGS. 6A through 6D. This is because these active links directly couple MOS devices to the high speed signal path thereby slowing the signal down because of the effects of the parasitic components inherent in each MOS device. With high speed data, the biCMOS differential current mode logic active links disclosed later herein are preferred, because the MOS devices in those active links are not coupled to the high speed signal path. Therefore, the MOS inverters of FIGS. 6A through 6D are likely to provide adequate isolation when disabled for low speed data FPGAs.

If a higher degree of isolation is desired for low speed or some higher speed FPGAs, the active links can simply be bipolar, CMOS or MOS tristate buffers of the type which are well known in the art. An active link of the tristate buffer type will have its data input coupled to conductor 78 and its data output coupled to line 80. The enable signal on line 86 will be coupled to the tristate control input of the tristate buffer. When the enable signal is in a logic state to disconnect line 78 from line 80, the tristate buffer will be put in a tristate mode wherein line 80 sees an essentially infinite impedance.

FIG. 7 is an example of a noninverting MOS tristate buffer taught in *Modern MOS Technology*, pp 217–8 which is used as an active link in low speed FPGAs according to the teachings of the invention. An NMOS transistor 102 forms a basic MOS inverter with depletion mode load transistor 104. This inverter is coupled through tristate circuitry to a totem pole push-pull driver comprised of NMOS transistors 106 and 108. The reason for the totem pole output driver is that use of a simple inverter to drive output loads which are usually capacitive will result in uneven rise and falltimes. This can possibly be remedied by increasing the load transistor size to improve the risetime, but this inordinately increases DC power consumption and the area of the inverter. The push-pull driver of FIG. 7 remedies this problem because when the output pull-down transistor 108 is turning on, the pull-up device 106 is simultaneously turning off. This ratioless configuration allows individual tailoring of device sizes for symmetrical waveform preservation.

Tristate operation can be achieved for the active link of FIG. 7 by raising the enable signal EN on line 86 to a logic 1. In this state, output lead 80 is isolated from both the high and low rails 90 and 92 by high impedances. This high impedance state is achieved when both output devices 106 and 108 are turned off by activation of the enable signal EN. When EN is activated, tristate NMOS transistors 110 and 112 turn on thereby grounding the gates of output transistors 106 and 108. Simultaneously, transistors 114 and 116 are turned off by EN* (the complement of EN) going to logic zero. This cuts off the gates of transistors 106 and 108 from their connections to the input line 78 and the output node 117 of the inverter, respectively.

Figure 8:
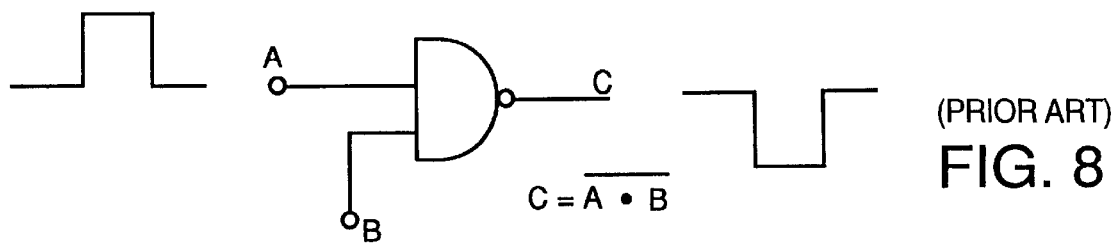
FIG. 8 is a circuit diagram for an active link in the form of a NAND gate.
Figure 9:
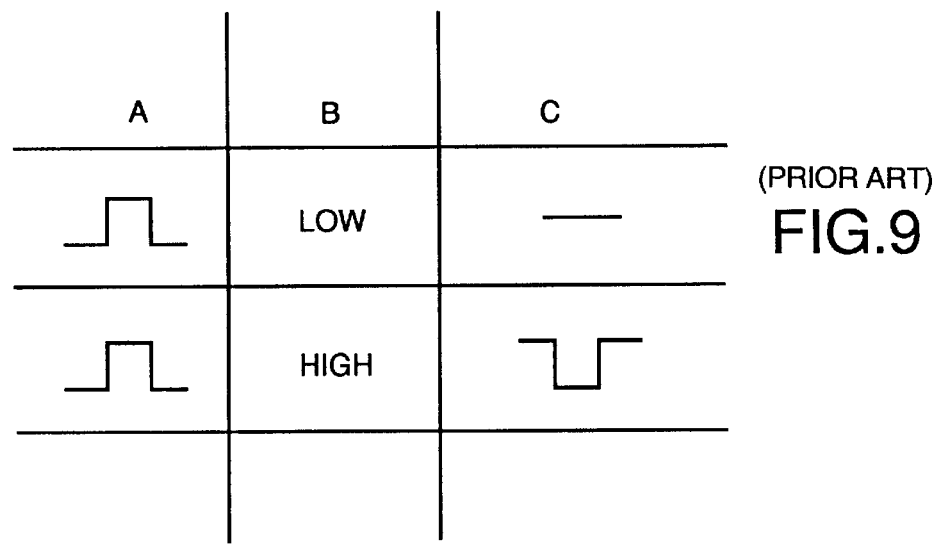
FIG. 9 is a truth table showing how the NAND gate of FIG. 7 is used as an active link.

One of the simplest forms an active link according to the teachings of the invention can take is a NAND gate of FIG. 8. This gate has A and B inputs and a C output. To use a NAND gate as an active link, the A input is connected to one of the conductors of the connection matrix to be connected and the C output is connected to another to be connected. The B input is connected to receive the enable signal which programmably controls whether the connection is or is not made. The truth table of FIG. 9 shows how A and C are selectively coupled under the influence of the enable signal B.

Of course NAND gates come in many different implementations some of which may be passive. Any NAND gate implementation capable of programmably connecting two or more lines together and having a gain of at least approximately one (or enough to provide a significant improvement in degration of rise and fall times characteristic of propagation through chains of passive links) will suffice to practice the invention. The circuit of FIG. 10 is one implementation of a NAND gate which can be used to implement an active link.

In the FIG. 10 CMOS implementation of a NAND gate to practice the invention, PMOS transistors 120 and 122 are connected in parallel and have their gates coupled to receive the A and B signals, respectively. Two complementary NMOS transistors 124 and 126 connected in series between common source node 128 and ground or the low voltage source also have their gates coupled to receive the A and B signals. When B is high, the connection between A and C is enabled, and transistor 126 is turned on and transistor 122 is turned off. Thus, when A goes high, transistor 124 turns on and transistor 120 turns off thereby grounding the common source node 128 which is coupled to output C. When A goes low, transistor 120 turns on and transistor 124 turns off thereby coupling output C to the high voltage reference 130 making output C a logic high. Because the NAND gate of FIG. 10 is an inverting gate, an even number of gates must be used to make the connections between standard cells to be connected.

In applications where more isolation is needed between the A and C lines than the CMOS devices provide, a tristate buffer can be added immediately after the switch.

Figure 11:
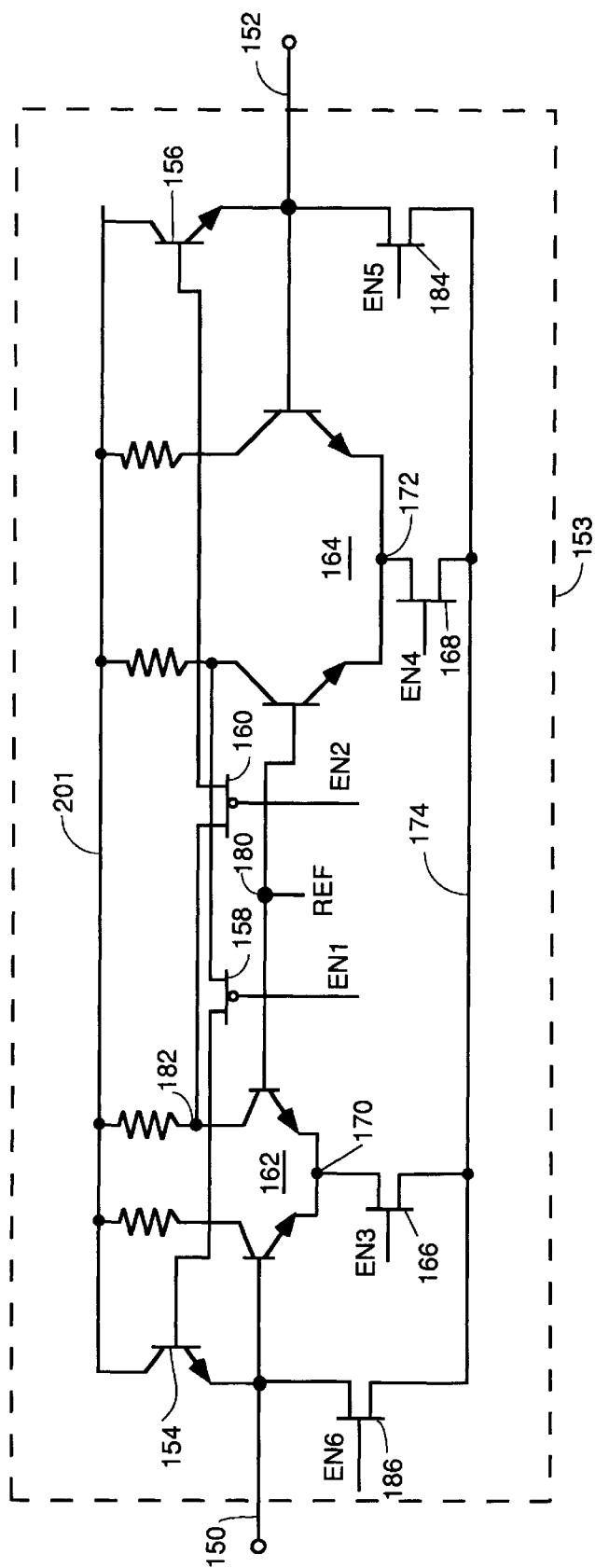
FIG. 11 is a bidirectional, high input impedance active link design using emitter followers to provide high input impedance.

Referring to FIG. 11, there is shown another circuit diagram for a preferred form of active link which can make buffered connections between two lines in a connection matrix. An advantage of the active link of FIG. 11 is that the deleterious effects of the series parasitic resistance and shunt parasitic capacitances of passive links in the prior art are reduced or eliminated and gain of approximately one or more can be applied to high speed signals propagating through the active link. This reduces the deterioration of rise and fall times of high speed signals as they propagate through a series of active links.

In the active link of FIG. 11, three different scenarios can be implemented depending upon the state of the enabling signals. They are:

1. line 150 isolated from line 152;
2. line 150 drives line 152;
3. line 152 drives line 150.

Which of these scenarios is implemented depends upon the programming of the enable signals transmitted into the circuitry inside box 153.

In case 1, NPN transistors 154 and 156 coupled as emitter followers are both disabled by programmable switches in the form of PMOS devices 158 and 160. All the MOS enabling transistors in FIG. 11 are referred to in the claims as programmable switches, but other programmable switching devices could be substituted. The PMOS devices are both turned off by virtue of the enable signals EN1 and EN2 both being high. In addition, current-mode, common emitter node current switches 162 and 164 are both disabled by virtue of the enable signals EN3 and EN4 being low. This causes NMOS devices 166 and 168 to be turned off thereby disconnecting the common emitter nodes 170 and 172 from the low rail voltage supply 174. No power is consumed in this state, and lines 150 and 152 are isolated and undriven.

The low rail conductor 174 and a high rail conductor 201 are coupled to a voltage source for development of a potential difference therebetween.

In case 2, the current switch 162 is enabled by driving enable signal EN3 high thereby turning on NMOS device 166 to connect common emitter node 170 to the low rail 174. Current switch 164 remains disabled by virtue of enable signal EN4 remaining in a logic 0 state thereby pinching off the channel in NMOS device 168. Emitter follower 154 is turned off because PMOS device 158 is off by virtue of enable signal EN1 being high. In this state, if the voltage of the input signal on line 150 is above the voltage of the reference voltage REF at node 180, then emitter follower 156 will drive output line 152 in accordance with the signal on line 150 by virtue of being coupled to the output node 182 of current switch 162 through PMOS device 160. In order for this to happen, the enable signal EN2 is driven low thereby turning on PMOS device 160, and enable signal EN5, and enable signal EN5 is driven high so as to turn on NMOS device 184 so as to enable the emitter follower 156 by connecting line 152 to ground. Enable signal EN6 is low in this mode thereby pinching off the channel of NMOS device 186. The structure of NMOS devices 186 and 184 and 166 and 168 is such that when their enable signals are high, the on resistance of the device supplies sufficient emitter feedback for their respective current switches or emitter followers to work. The on resistance of devices 186 and 184 should however be low enough that the RC time constant of this on resistance coupled to the parasitic capacitance of lines 150 or 152 as the case may be is sufficiently low so as to not substantially degrade the rise time of the high speed data signals propagating through the active link.

If the input signal at line 150 is below the reference voltage REF at node 180 in case 2 operation, then current flow through the emitter follower 156 and NMOS device 184 pulls line 152 down to a logic zero level.

Operation in case 3 is similar but reversed to operation in case 2. In this case, line 152 drives line 150 through emitter follower 154. In case 3, the enable signal EN4 is high, and enable signal EN5 is low. Enable signal EN6 is high so as to enable emitter follower 154, and enable signal EN1 is low so as to turn on PMOS device 158. Enable signal EN2 is high so as to turn off PMOS device 160 thereby disconnecting emitter follower 156 from current switch 162. In this state, when the signal on line 152 is higher than the reference voltage REF (set between logic 1 and logic 0 levels), emitter follower 154 drives output line 150 high. When the signal on line 152 is below the voltage of the reference voltage REF, emitter follower 154 pulls line 150 low.

The active link switching circuit of FIG. 11 has 6 different enable signals the logic states of which control in which of the three states the active link operates. These enable signals EN1 through EN6 may be supplied from 6 separate memory cells like memory cell 200 in FIG. 5, or they may be supplied by any other means which allows programmability of the FPGA active links to operate as desired.

An advantage of the active link of FIG. 11 is that it does not load whatever driving device is coupled to it, and this is true regardless of whether line 152 is driving line 150 or line 150 is driving line 152. In either mode, the driving device sees the essentially infinite input impedance of an emitter follower buffer. In the mode where line 150 is driving line 152, the driving device sees the high input impedance of emitter follower 156. In the mode where line 152 is driving line 150, the driving device sees the high input impedance of emitter follower 154.

Figure 12:
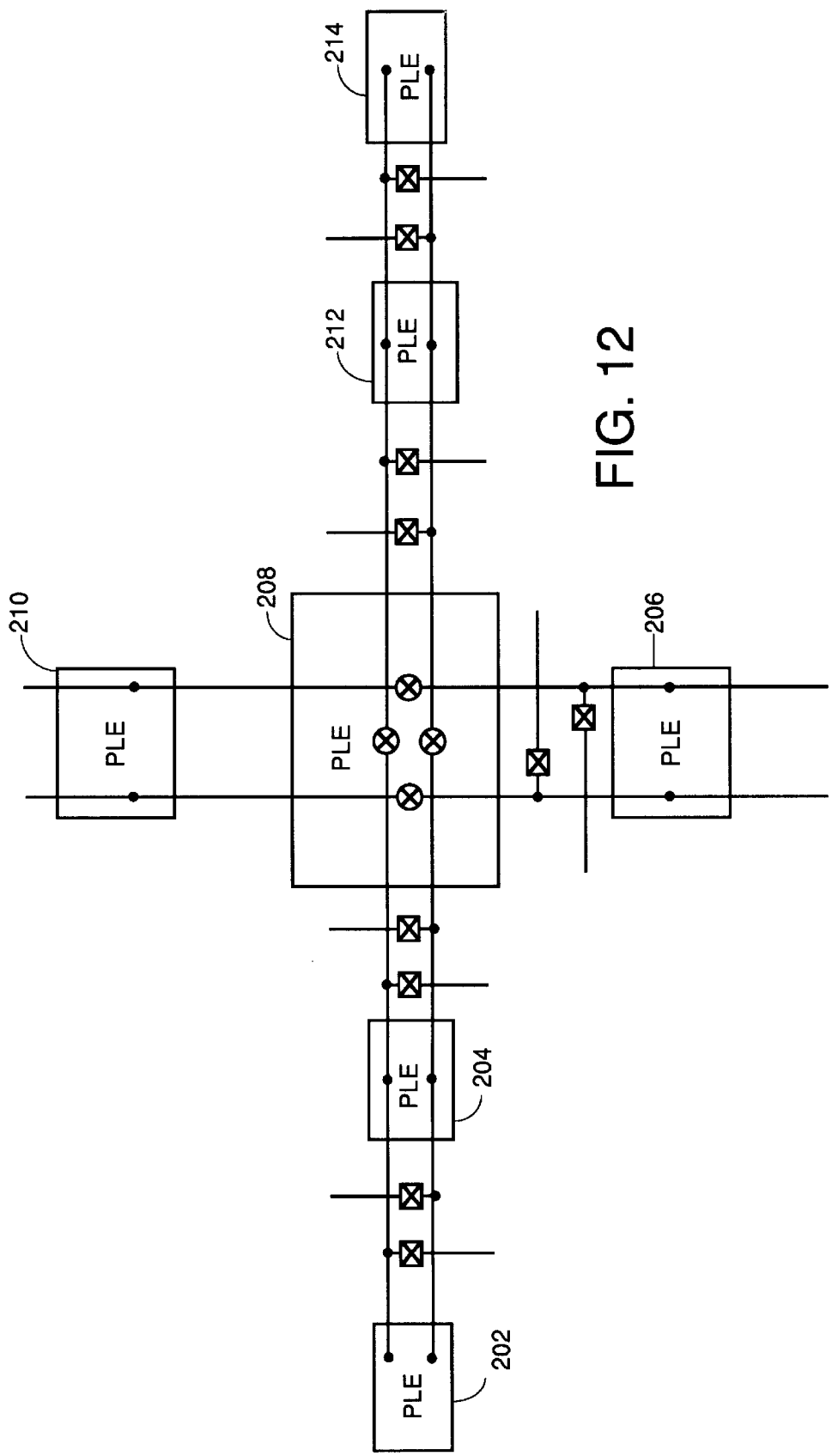
FIG. 12 is a symbolic diagram of an FPGA using both long range and short range active links.

A useful FPGA architecture using the active link teachings of the invention is shown in FIG. 12. In this symbolic arrangement, programmable or nonprogrammable logic elements 202, 204, 206, 208, 210, 212 and 214 are programmably connected to each other and other devices elsewhere on the integrated circuit die. These connections are made by active links designated by the circles and boxes with Xs inside them. The active links shown as Xs inside circles inside PLE 208 are short range active links suitable for driving short lines coupling a PLE to it nearest and next nearest neighbors. Examples of the types of active link circuits disclosed herein which could be used for such short range active links are any of the active link circuits disclosed herein with short line drive capability such as the NMOS inverters, NAND gates etc.

To account for situations where signals must connect to devices that are not neighbors, the active links symbolized by Xs inside boxes are provided. These active links are designed to drive longer lines to enable connection of signals between circuits separated by as much as the entire width or length of the integrated die. An example of good long range active link designs are the NMOS inverter with totem pole, push-pull driver stage shown in FIG. 7 or the programmably bidirectional active link with emitter follower output stages of FIG. 11.

The significance of using two different types of active links on an FPGA is that each different type of active link will have different parasitics, different delay characteristics, different power requirements and different input and output impedances and different complexity in terms of the number of devices needed, the number of programming bits needed and the amount of chip area consumed. Some of these active links will be better than others for driving short lines and some will be better for driving long lines. Since most FPGA layouts have standard cells or logic circuits connected to neighboring circuits, it is beneficial to have at least two different types of active links and use the short range ones for most link sites and only use the bigger, more complex active links where absolutely necessary to drive long lines.

This allows high speed signals to propagate at much higher speeds than in the prior art. The reason is that the gain in the active link and/or the energy supplied to the propagating signal by each active link as it passes through the active link replenishes energy dissipated in parasitic resistance or lost to the substrate through shunt parasitic capacitance thereby arresting or reducing the amount of deterioration of signal rise times as a signal propagates across the chip. The circuit of FIG. 7 is well adapted for use as the long range active links because of the totem poll, push-pull output stage.

Figure 13:
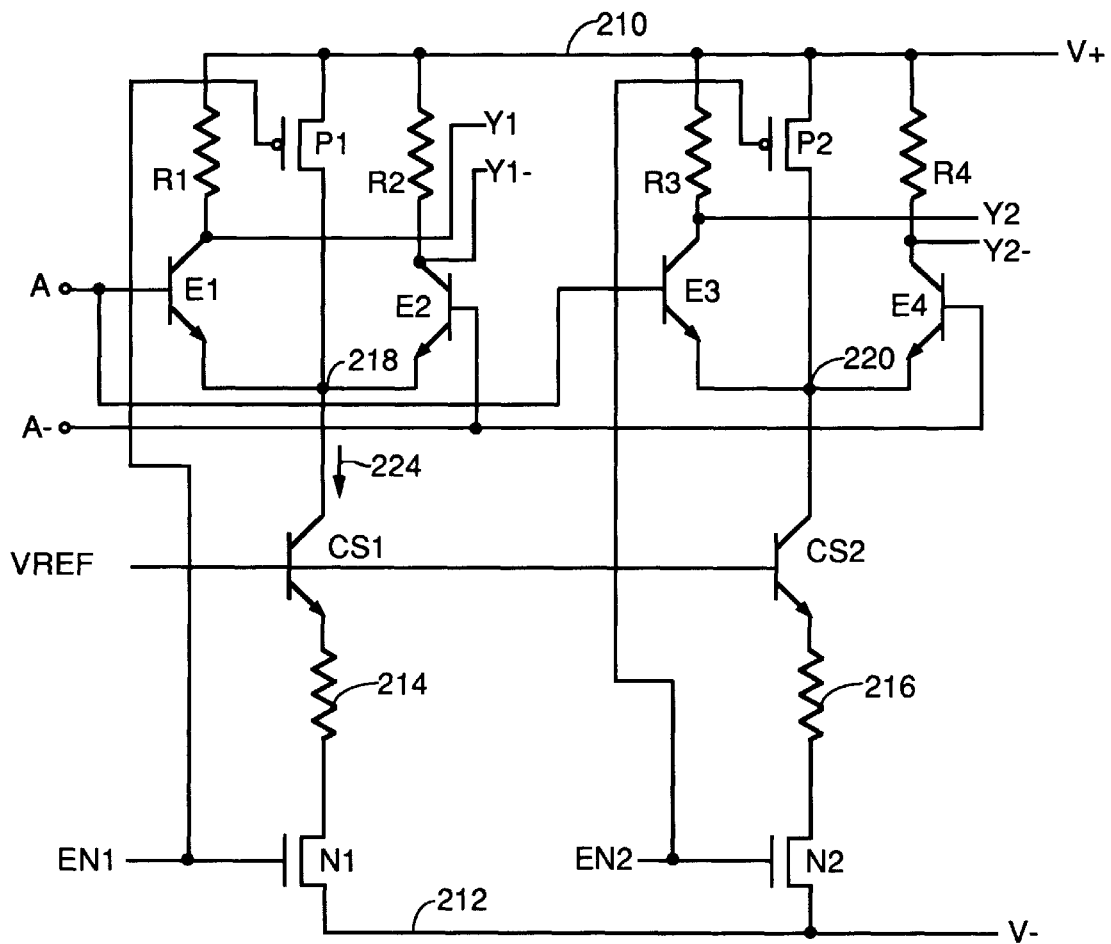
FIG. 13 is a circuit diagram of an active link in the form of a biCMOS, differential, current-mode, one-input-two-output multiplexer.

Referring to FIG. 13, there is shown a circuit diagram for a one-input-two-output multiplexer embodiment of an active link suitable for use in implementing programmable logic circuitry that must process very high speed signals. In the embodiment shown in FIG. 13, emitter-coupled-logic (ECL) circuitry is used in the data path, and CMOS circuitry is used for steering the input signals from the inputs to one or more of the outputs. In other embodiments, other fast technologies may be used in the data path such as bipolar, Josephson junction, ballistic effect devices etc. The data inputs for high speed data are shown at A and A-. These two inputs are coupled to two ECL differential pairs comprised of a first pair of transistors E1 and E2 and a second pair of transistors E3 and E4. Transistors E1 and E2 have load resistors R1 and R2, respectively. Transistors E3 and E4 have load resistors R3 and R4, respectively. The first data input A is coupled to the bases of ECL transistors E1 and E3. The complementary data input A- is coupled to the bases of ECL transistors E2 and E4. The collectors of the E1 and E2 pair are coupled to the Y1 and Y1- outputs, respectively. The collectors of the E3 and E4 pair are coupled to the Y2 and Y2- outputs, respectively. Each of the ECL transistors is coupled to the high voltage supply rail 210 via a collector load resistor where R1 is the load resistor for transistor E1 and R4 is the load resistor for E4 etc.

The emitters of transistors E1 and E2 are coupled so as to share a common constant emitter current regulated by current source transistor CS1, and the emitters of transistors E3 and E4 are coupled so as to share a common constant emitter current regulated by current source transistor CS2. The bases of these two current source transistors are coupled to a reference voltage VREF, and the emitters are coupled to the low voltage supply 212 through emitter feedback resistors 214 and 216 and through NMOS steering transistors N1 and N2. The gate terminals of transistors N1 and N2 are coupled to enable signal lines EN1 and EN2, respectively. These two enable signal lines are also coupled to two PMOS steering transistors P1 and P2, respectively, which are coupled between the high voltage supply 210 and the common emitter nodes 218 and 220.

The operation of the circuit of FIG. 13 is as follows. The fundamental purpose of the circuit is to steer the signals in the data path on complementary signal lines A and A- onto one or both of the complementary output signal pairs Y1/Y1- or Y2/Y2- without substantially degrading the rise or fall times of the high speed signal so as to implement a one-input-two-output multiplexer type active link. This is done using the EN1 and EN2 enable or steering signals from associated memory cells and the CMOS steering transistor pairs N1/P1 and N2/P2, the CMOS steering transistors being outside the data path so as to not expose the high speed data to the effects of the parasitic resistance and capacitance of the CMOS devices. Those skilled in the art will appreciate that the concept illustrated in the circuit of FIG. 13 can be extended to more outputs than two and can be reversed to steer input signals on one of a plurality of inputs onto a single output.

Assuming now for illustration that the EN1 enable signal is active, i.e., high. This causes the steering transistor N1 to conduct thereby connecting the steering transistor N1 to the low voltage power supply and causes the steering transistor P1 to be nonconductive. This has the effect of activating the output pair Y1 and Y1- by enabling the current source CS1 to draw the fixed current represented by arrow 224 out of node 218. Current source transistor CS1 stabilizes the current flow out of node 224 by virtue of the negative feedback to the emitter caused by emitter resistor 214 as is well-known in the art. Because transistor P1 is nonconductive, the common emitter node 218 is not held at the voltage of the high voltage supply 210, and the ECL transistors E1 and E2 are free to drive the outputs Y1 and Y1- as an ordinary current mode logic buffer/inverter under the influence of whatever data signals are present on the data inputs A and A- as in normal ECL differential mode operation. If the EN2 steering signal is not active, i.e., low, simultaneously with the active high state of the EN1 steering signal, the Y2 and Y2- outputs are deactivated. This results from the fact that the steering transistor N2 is not conductive thereby disabling the current source transistor CS2 from drawing current from common emitter node 220. When steering signal EN2 is low, the PMOS steering transistor P2 is conductive thereby driving the common emitter node 220 to the voltage of the high voltage source 210. This affirmatively reverse biases the base-emitter junctions of the ECL transistors E3 and E4 rather than leaving the common emitter node 220 floating so as to positively cut off the E3 and E4 transistors and prevent any signal leakage from the inputs A and A- to the outputs Y2 and Y2.

In some embodiments where this positive cutoff of the ECL transistors of the pair associated with whatever steering signal EN1 or EN2 is low, is not necessary and a floating common emitter node 218 or 220 provide adequate isolation between the input and output when the associated current source is not active, the PMOS transistors P1 and P2 can be eliminated.

If the enable signal EN2 is high, the NMOS steering transistor N2 is conductive and the PMOS steering transistor P2 is rendered nonconductive. This has the effect of activating the two outputs Y2 and Y2- by connecting the current source transistor CS2 to the low voltage supply thereby causing the transistors E3 and E4 to drive the outputs Y2 and Y2- in accordance with whatever data signals are on the A and A-data inputs. This is true regardless of whether steering signal EN1 is simultaneously active high. If EN1 is simultaneously low when EN2 is high, steering transistor N1 is nonconductive and steering transistor P1 is conductive. This drives common emitter node 218 to the voltage of the high voltage rail and reverse biases the emitter-base junctions of the ECL transistors E1 and E2 thereby isolating the inputs A and A3 from the outputs Y1 and Y1-.

By controlling which of steering signals EN1 and/or EN2 are high, it is possible to connect the input signal pair A, A- to either or both of the output signal pairs Y1, Y1- or Y2, Y2-. Thus, by control of the states of signals EN1 and EN2, it is possible to electronically control the switching of very high speed signals at an input to any of a plurality of outputs without substantially slowing down the signals even though CMOS steering transistors are used. Because the resistivity of the NMOS steering transistors N1 and N2 is much lower than the resistance of the emitter feedback resistors 214 and 216, the presence of the NMOS transistors N1 and N2 in the path between the emitters of the current source transistors CS1 and CS2 to the low voltage rail does not appreciably affect the speed of operation of the circuit.

The structure of FIG. 13 can be extended to more ECL differential pairs driving more output pairs, but there is a limit imposed by the loading on the input signal lines A and A- caused by the junction capacitances of the ECL transistor bases. Also, since the beta factor of the ECL pairs is not infinite, adding more ECL pairs causes the base current to exceed accepted ECL limits of no more than 10–20 bases coupled to one signal. The preferred limit of the number of bases which can be coupled to input signal lines A and A- is from 4 to 8. It is preferable for the load on A and A- signal lines to not be dependent upon the number of transistors connected thereto.

Figure 14:
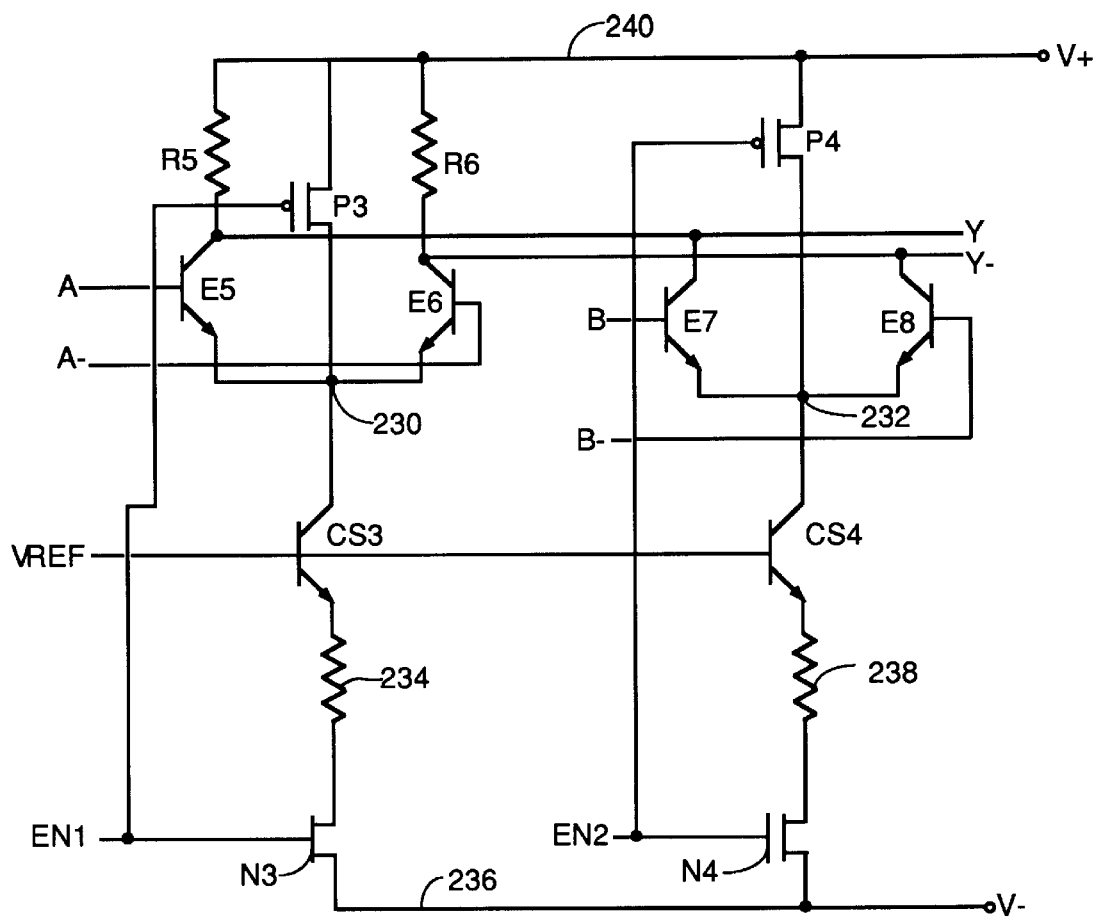
FIG. 14 is a circuit diagram for an active link biCMOS differential, current-mode, two-input-single-output multiplexer.

Referring to FIG. 14, there is shown a circuit diagram for a two-input-single-output multiplexer active link for steering high speed signals without substantially degrading the rise or fall times thereof. A first ECL transistor pair E5 and E6 share a common emitter node 230, while a second ECL transistor pair E7 and E8 share a common emitter node 232. Common emitter node 230 is coupled to a constant current source comprised of transistor CS3 and emitter feedback resistor 234. This constant current source is turned off and on by an NMOS steering transistor N3 which couples the current source to the low voltage supply line 236. The transistor pair E5 and E6 each have a load resistor, R5 and R6, respectively, which is shared with a second ECL transistor pair E7 and E8 via a pair of single output lines Y and Y-. The second transistor pair E7 and E8 share emitter node 232 and share a constant current source comprised of transistor CS4 and emitter feedback resistor 238. The CS4 constant current source is selectively coupled to the low voltage supply rail 236 by an NMOS steering transistor N4. As in the case of the embodiment of FIG. 13, two PMOS steering transistors P3 and P4 are used to positively control the voltage of common emitter nodes 230 and 232, respectively.

The first ECL transistor pair ES and E6 is enabled when the enabling signal EN1 is high. This condition turns the NMOS transistor N3 on and couples the current source transistor CS3 to the low voltage supply 236. The transistors E5 and E6 are coupled to a high voltage supply line 240 through their respective load resistors R5 and R6. When EN1 is high, PMOS transistor P3 is off which releases the common emitter node 230. Thus, transistors ES and E6 are enabled to drive the output lines Y and Y- under the influence of whatever signals are on the high speed input signal lines A and A-. Note that if EN1 is high, care must be taken to insure that EN2 is not simultaneously high as this would cause a conflict in that ECL pair E7 and E8 would be simultaneously trying to drive the output lines Y and Y- at the same time transistors E5 and E6 were trying to drive the same lines, possibly with conflicting signal levels. This conflict is avoided if the steering signal EN2 is low when steering signal EN1 is high, because a low EN2 causes PMOS transistor P4 to be turned on which drives the shared emitter node 232 to the voltage of the high voltage supply line 240. This disables E7 and E8 by reverse biasing the emitter-base junctions thereof. Likewise, when EN1 is low, transistors ES and E6 are disabled in the same way.

In alternative embodiments of the circuit of FIG. 14, interlock circuitry is employed to prevent both EN1 and EN2 from being active high simultaneously. Also, in some embodiments, the PMOS transistors P3 and P4 can be omitted where leaving the shared emitter node floating is an acceptable way of disabling the ECL transistor pairs.

The multiple input, single output arrangement of FIG. 14 can be extended to many different input pairs driving many different ECL pairs sharing a single output pair, as will be apparent to those skilled in the art. If such a circuit were to be implemented as an integrated circuit, all transistors whose collectors are connected to the same output line could share the same collector tub on the integrated circuit die thereby creating vast savings in layout area. Thus, for example, four separate input pairs could drive four ECL transistor pairs sharing a single output pair and a single pair of load (pull up) resistors. The four transistors coupled to one output line of the output pair would share the same collector tub and likewise for the four transistors coupled to the other output line. At most one of the four ECL pairs would be enabled by its corresponding steering signal while all other steering signals would be inactive.

Figure 15:
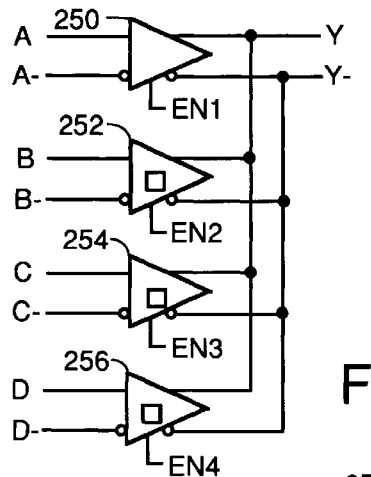
FIG. 15 is a circuit diagram of another notation for the multiplexer of FIG. 14 having four inputs and a single output.

Such an embodiment is shown symbolically in FIG. 15. In the notation used in FIG. 15, ECL pair E5 and E6 with pull up resistors R5 and R6 and their associated current sources and MOS steering transistors are represented by switch 250 while ECL pairs without pullup resistors such as transistors E7 and E8 and their associated current sources and MOS steering transistors are represented by switches 252, 254 and 256.

In FIG. 15, the first ECL transistor pair is driven by high speed signal input lines A and A- in the data path, while the second ECL transistor pair is driven by high speed input signal lines B and B-. Both ECL transistor pairs drive a single pair of shared output signal lines Y and Y- and share a single pair of pull up resistors.

Figure 16:
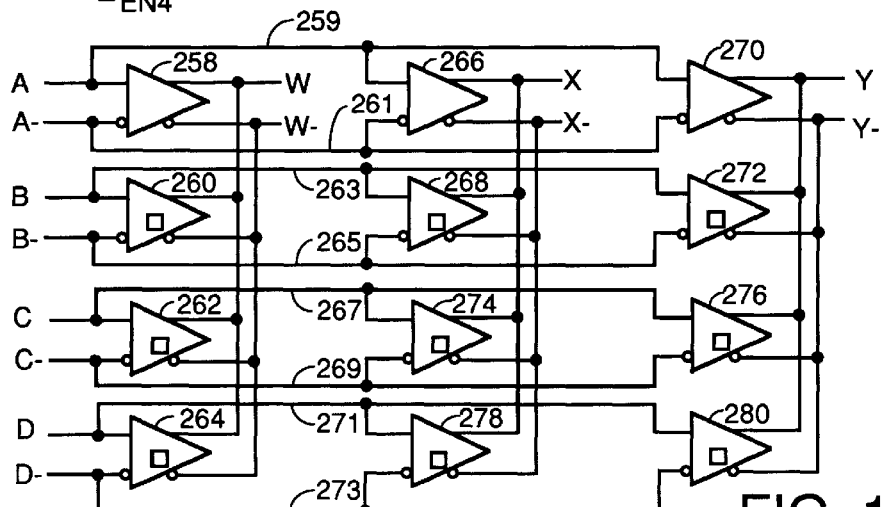
FIG. 16 is a circuit diagram for a crossbar switch having four inputs and three outputs using the notation of FIG. 15.

Referring to FIG. 16, there is shown a symbolic diagram of a four-input-three-output crossbar switch comprised of active links of either the long range or short range variety. Each triangle in FIG. 16 represents an active link. The particular cross-bar switch shown has three modules like that shown in FIG. 15 interconnected such that the data inputs of the first module comprised of switches 258, 260, 262 and 264 also drive the data inputs from corresponding switches in the other two modules. Specifically, the A and A-data inputs to switch 258 are coupled not only to the data inputs of switch 258, but also to the data inputs of switches 266 and 268 via lines 259 and 261, and the B and B- data inputs drive the data inputs of both the switch 260 and the switches 268 and 272 via lines 263 and 265. The C and C-data inputs are similarly connected so as to drive the data inputs of switches 262, 274 and 276 via lines 267 and 269, and the D and D- data inputs are coupled to drive the data inputs of switches 264, 278 and 280. For clarity of the figure, the separate enable inputs of each switch are not shown, but each switch has an enable input coupled to receive a steering signal such as the signal EN1 in FIGS. 13 or 14. These steering signals are coupled to the CMOS steering transistors that control enabling of the ECL transistor pair of each switch in the manner described above for the circuits of FIGS. 13 and 14. The concept of FIG. 16 can be extended to any number of modules and any number of inputs and outputs limited only by the fanout specifications or loading limitations on each input and output of the switch.

Operation of the crossbar switch of FIG. 16 is a straightforward function of activating selected ones of the steering signals. For example, if it is desired to pass the D and D-signals on to only the W and W- outputs, the enable signal to switch 264 would be activated and all other enable signals to all other switches would be inactive. If the D and D-outputs were to be steered to the X and X- outputs, the enable signal for only switch 278 would be active, and all other enable signals to all other switches would be inactive.

Any input pair can be coupled to any one or more output pairs in the architecture of FIG. 16, and two or more inputs can be coupled to two or more outputs simultaneously as long as no output is coupled to more than one input at any particular time. For example, the A and A-inputs can be coupled to the W and W- and X and X-inputs simultaneously while the D and D-inputs are simultaneously coupled to the Y and Y-inputs. Many other combinations are also possible as will be apparent to those skilled in the art.

The architecture of the crossbar switch of FIG. 16 can be extended to larger numbers of input pairs and/or output pairs.

Simulations of the operation of a 4×4 (four input pairs and four output pairs) crossbar switch having an architecture like that of the circuit of FIG. 16 has shown propagation delays of about ¼ nanosecond. This is much faster than the propagation delays of such crossbar switch circuits implemented using CMOS in the data path. That is, the time it takes for a change of level on any output pair to propagate through the circuit and cause a corresponding change in level on any one or more selected output pair is ¼ nanosecond.

The circuits shown in FIGS. 13 through 16 all use current mode logic which has a maximum output voltage swing on the order of 300 millivolts. If the output voltage swing is stretched to a value more than 300 millivolts, soft saturation or total saturation can occur in the ECL transistors. This is highly undesirable because saturation or soft saturation of current mode logic switches substantially decreases the switching speed thereof. Thus, in the preferred embodiment, emitter followers are used as output buffers so as to increase the permissible output voltage swing.

There are other reasons to use emitter followers either as active links or in conjunction therewith. Specifically, in addition to having very high input impedance which is useful to prevent the driving circuit from being loaded down, emitter followers can be used to shift the voltage levels so as to drive other logic families. Emitter followers can also be used to create higher current source or sink capacity for driving long lines which is useful for construction of the long range active links of FIG. 12.

To provide maximum flexibility, it is desirable to be able to couple the output of a current mode logic switch active link to any one or more of a number of emitter follower arrangements, some of which may have different characteristics such as different output voltage levels, logic swing or current source or sink capacity.

Figure 17:
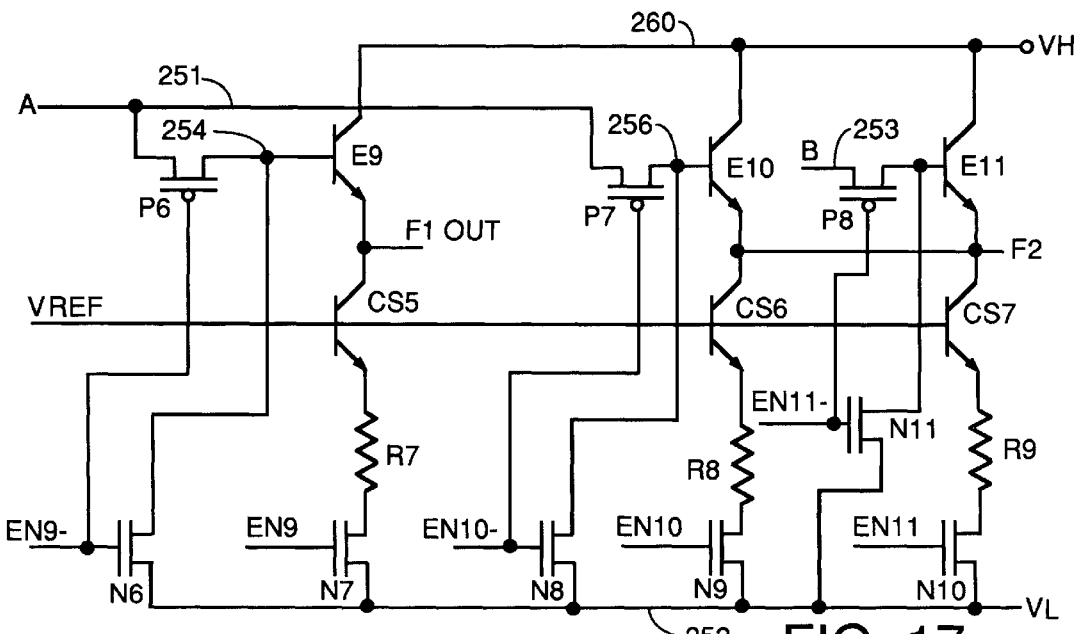
FIG. 17 is a circuit diagram of a typical set of high speed emitter followers for use with the circuits of FIGS. 13–16 as a driver to provide high input impedance or as a stand-alone, field-programmable active link.

To provide this flexibility, the circuit of FIG. 17 may be used alone as a multiplexing active link or in conjunction with other active link circuits to provide long line drive capability, voltage level shifting, better isolation etc. In the circuit of FIG. 17, a data output line A from the output of a current mode logic switch or any other type of active link or boilerplate circuit is coupled via line 251 to two emitter followers comprised of ECL transistors E9 and E10 which drive output lines F1 and F2. Each of these emitter follower transistors has an associated current source and associated CMOS enabling circuitry. Specifically, transistor E9 drives output line F1 and has its emitter coupled to a current source transistor CS5 which has an emitter feedback resistor R7 and which has its base coupled to a constant reference voltage Vref as was the case with the current source transistors of the circuits of FIGS. 13–16. The CMOS enabling circuitry for emitter follower transistor E9 is comprised of NMOS transistors N6 and N7 and PMOS transistor P6. Likewise, emitter follower transistor E10 has its emitter coupled to a current source transistor CS6 having emitter feedback resistor R8. The base of the current source transistor CS6 is coupled to the constant reference voltage line Vref. The enabling CMOS circuitry for the current source E10 is comprised of NMOS transistors N8 and N9 and PMOS transistor P7.

Emitter follower E9 is enabled when the steering signal EN9 is active high and complementary steering signal EN9- is active low. This state causes NMOS transistor N7 to be turned on thereby activating the current source transistor CS5 by coupling its emitter to the low voltage supply line 252. Because EN9- is active low, NMOS transistor N6 is turned off and PMOS transistor P6 is turned on thereby allowing the base of transistor E9 to assume whatever voltage high speed input signal A currently has. Note that although a PMOS transistor P6 is in the high speed signal path, the load on this transistor is very light comprised of only one ECL transistor base and one NMOS transistor drain. This light load does not appreciably slow down signal propagation. It is necessary to use the P6 transistor in the embodiment shown in FIG. 17 because it is necessary to disconnect the high speed signal A from the base of transistor E9 when the base is coupled to the low voltage supply 52 so that the high speed data signal is not loaded down thereby slowing signal propagation.

To disable emitter follower E9, steering signal EN9 is driven to its inactive low state and complementary steering signal EN9- is driven to its inactive high state. This state causes NMOS transistor N7 to turn off and NMOS transistor N6 to turn on simultaneously with PMOS transistor P6 turning off. This causes current source transistor CS5 to be disconnected from the low voltage supply line 252 and become inactive thereby disabling the emitter follower transistor E9. Simultaneously, the base 254 of NPN transistor E9 is coupled to the low voltage supply 252 to reverse bias the base-emitter junction and the base 54 is cut off from the A data input line 251 by virtue of transistor P6 turning off. By coupling the base 254 of transistor E9 to the low voltage supply, the base-emitter junction of NPN transistor is reverse biased thereby preventing any voltage source coupled to the F1 output from accidently turning transistor E9 on.

Emitter follower E10 works in the same fashion as emitter follower E9. However, it may have a different physical geometry or emitter feedback resistor R8 may have a different value so as to present different voltage levels on output line F2. Further, emitter follower E10 may be designated so as to be able to source more current to output line F2 to drive a long line. Thus, when steering signal EN10 is active high and steering signal EN10- is active low, NMOS transistor N9 is on enabling the current source transistor CS6 and NMOS transistor N8 is off while PMOS transistor P7 is on thereby connecting the base 256 of NPN transistor E10 to high speed data input A. To turn off E10, steering signal EN10 is made inactive low and steering signal EN10- is made inactive high.

Note that the architecture of the circuit of FIG. 17 allows the high speed data signal A to drive either output F1 or output F2, or both simultaneously or neither depending upon the states of the steering signals EN9 and EN10 and their complements. Each emitter follower has a gain of approximately one or greater and presents a high input impedance to the data input A so as to prevent unnecessary loading of whatever circuit is driving data input A.

Another high speed data input, B, on line 251 is coupled to the base of an NPN emitter follower transistor E11 which also drives output F2. If level shifting of the output swing of output F2 were desired when driven by input B, emitter follower transistor E11 could be replaced by two transistors in series such that two base emitter drops of approximately 850 millivolts would be imposed between the high voltage supply line 60 and the output F2 when the emitter follower E11 is turned on. Emitter follower E11 and its steering circuitry works the same way as emitter followers E9 and E10. Specifically, when steering signal EN11 is active high and its complement EN11- is active low, NMOS transistor N10 is on and activates current source transistor CS7 by coupling the emitter thereof to low voltage supply line 252. The base of transistor CS7 is coupled to the constant reference voltage Vref as are the bases of current source transistors CS5 and CS6. Simultaneously, NMOS transistor N11 is turned off by the low state of EN11- and PMOS transistor P8 is turned on thereby connecting the high speed data input B to the base of emitter follower transistor E11. This causes the changes in logic level of high speed data input signal B to be reflected on output F2 while imposing the buffering, level shifting and boosted current drive benefits of the emitter follower E11 between the high speed data input signal B and the output signal F2 which follows it.

Thus, by driving steering signal EN11 active high and steering signal EN10 inactive low and the complementary steering signals to their corresponding active/inactive states, it is possible to drive output F2 with input B. Likewise, by driving steering signal EN10 active high and steering signal EN11 inactive low and the complementary steering signals to their corresponding active/inactive states, it is possible to drive output F2 with input A. It is not permitted to have both steering signals EN10 and EN 11 active high at the same time, although it is permitted to have both inactive low simultaneously.

Note that the inputs A and B on lines 251 and 253 may be coupled to any of the outputs shown in FIG. 13–16 such as Y or Y- etc., and note that duplicate emitter follower circuitry may be used to couple to the complementary outputs. Also, the outputs F1 and F2 may be coupled to the inputs of the single ended circuit of FIG. 18 to provide any necessary one Vbe drop (base-emitter voltage drop) to properly bias that circuit. The number of possible permutations and combinations of the fast switching circuits and emitter follower circuitry that does not impede the switching speed according to the teachings of the invention are too numerous to draw them all, but they will be apparent to those skilled in the art. Any fast switching circuit that uses MOS enabling circuitry that is substantially removed from the data path to enable the switch or do a steering function for the high speed data signals is equivalent to what is taught herein and intended to be within the scope of the claims appended hereto.

The consequence of use of the architecture of FIG. 17 in conjunction with the architecture of any of FIGS. 13–16 is that the high speed switches of FIGS. 13–16 may be coupled to any other type of logic family regardless of the logic levels of the logic family to which the high speed switches are to be coupled. The level of the output signals at outputs F1 and F2 can be raised by raising the voltage at the high voltage supply line 260 or changing the values of emitter feedback resistors R7, R8 and R9 and changing the characteristics of the current source transistors and/or changing the reference voltage Vref to alter the level of current flowing through the emitter feedback resistors. Likewise, output level voltages can be shifted downward by coupling more emitter follower transistors in series so that all transistors in the chain turn on or off simultaneously with changes in the input signal levels and so as to impose their base-emitter voltage drops in series between the high voltage supply line 260 and the corresponding output. This level shifting can be done without loss of the advantage of ECL speeds. This provides great flexibility to designers. For example, in well-known differential mode cascade logic, one set of data inputs coupled to the lower differential pair substituted for the normal current source must be driven between level changes which are uniformly one base-emitter voltage drop (approximately 850 millivolts) below the corresponding levels of the other set of data inputs coupled to the upper differential pair. This can be done using the emitter follower technology of FIG. 17, for example by driving one set of inputs with the F1 output and driving the other set of inputs coupled to the lower differential pair with output F2 and substituting a pair of series coupled emitter followers for single emitter followers E10 and E11.

Those skilled in the art will appreciate that the concepts illustrated in FIG. 17 can be extended such that input A can drive more emitter followers and more outputs, and the crossbar switching capabilities of input A or B being able to drive input F2 can be extended to more inputs and outputs by modification of the circuit of FIG. 17. Likewise, the concepts illustrated in FIGS. 13–16 may be extended to more inputs and more outputs and can be extended to single ended technology. Generally, differentially coupled current mode logic devices are preferred, because the logic swing can be reduced with adequate noise immunity and therefore great speeds can be achieved. However, where integrated circuit space is an issue, and the number of transistors is to be held down, single ended logic can also be used.

Figure 18:
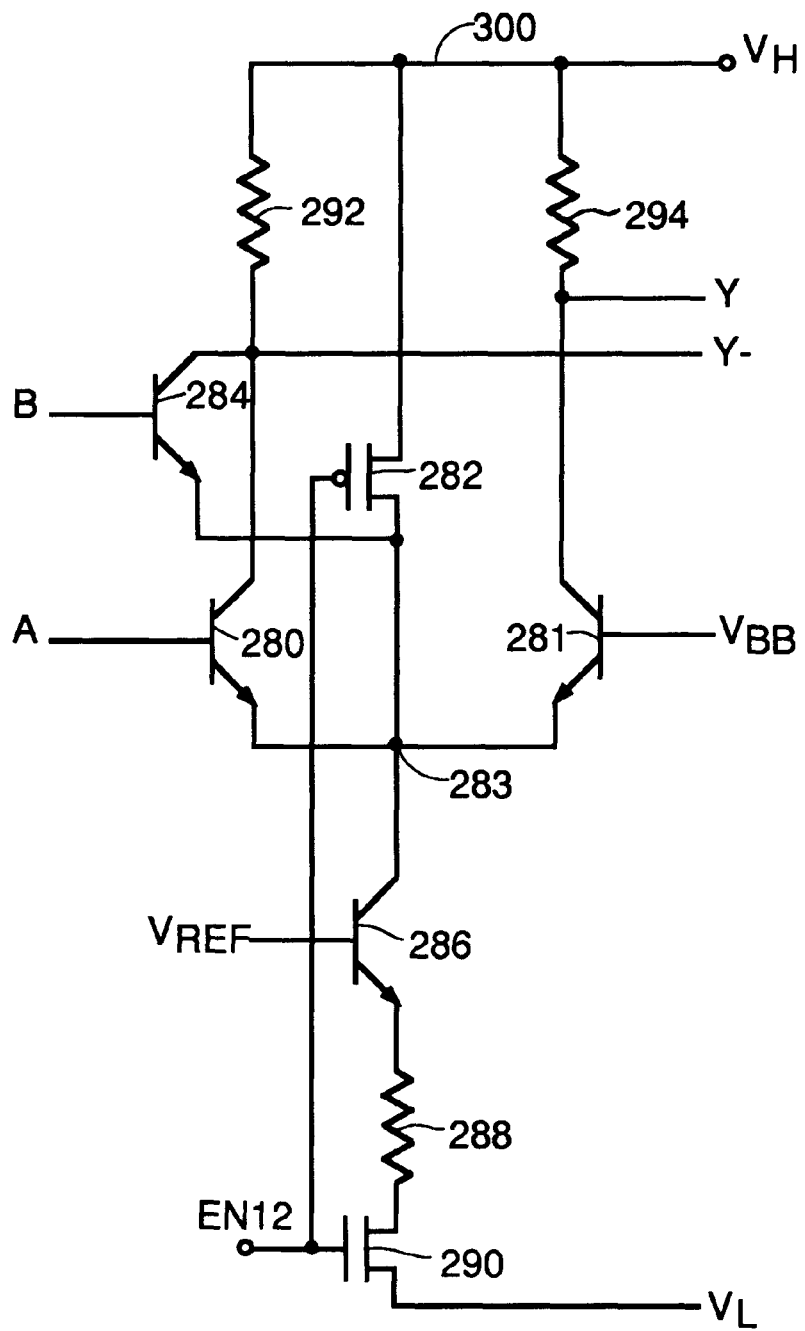
FIG. 18 is a circuit diagram of one example of how the structures of FIGS. 13–16 can be implemented in single ended ECL technology.

For example, a single-ended, fast OR gate employing the teachings of the invention is shown in FIG. 18. In this circuit, a differentially coupled pair current mode NPN transistors 280, 281 and 284 are coupled to share a common node 283. A reference signal Vbb is coupled to the base of transistor 281, and high speed data input signals A and B coupled to the bases of transistors 280 and 281 have logic states which swing both above and below the level of Vbb. A constant current source comprised of transistor 286 and resistor 288 selectively drives the common node 283 when NMOS transistor 290 is turned on. This occurs when steering signal EN12 is active high. When this occurs, PMOS transistor 282 turns off and common node 283 is free to seek whatever voltage it normally assumes when the differential pair is enabled. The transistors 284, 280 and 281 then drive the outputs Y and Y-. Pullup resistors 292 and 294 couple the outputs to the high voltage source. The voltage swings of the signals on inputs A and B can be increased to increase noise immunity, but the high level of either signal cannot be higher than one base-emitter voltage drop below the level of Vh on the line 300. Thus, an emitter follower according to the teachings of FIG. 17 could be used to drive the A and B inputs if necessary to provide the necessary one base-emitter drop.

The concept of FIG. 18 can be extended to any of the other switches or arrays shown in FIGS. 13–16 as will be apparent to those skilled in the art. Further, although NPN bipolar current mode logic technology is used for illustration, PNP bipolar technology could also be used, and any differentially coupled circuit could also be single ended. Further, other high speed switching technologies either now existing or to be invented in the future could also be used to implement the teachings of the invention if the slower enabling/steering logic is kept out of the high speed data path.

Although the invention has been described in terms of the preferred and alternative embodiments disclosed herein, those skilled in the art will recognize various structural and functional equivalents of the circuits disclosed herein. For example, any of the differential current mode logic current switches could be replaced by single ended versions such as are shown in FIG. 18. Other fast switching technology could be substituted for the bipolar devices shown herein and bipolar or other faster switching devices could be substituted for the CMOS enabling devices. All such structural and functional equivalents are intended to be included within the scope of the claims appended hereto.

What is claimed is:

1. A field programmable gate array, comprising:
    a plurality of logic blocks that needs to be connected together in a programmable way to implement a desired function for said field programmable gate array;
    a plurality of input/output pins;
    a connection matrix coupling said logic blocks together or to said input/output pins in a programmable manner to form a circuit capable of carrying out a desired function specified by a user of said field programmable gate array, said connection matrix characterized by a plurality of conductors coupled to signal inputs and signal outputs of said logic blocks or to said input/output pins and programmably coupled to each other at every one of a plurality of programmable connection sites by programmable active links, each active link being programmable to present either a high impedance path or a low impedance path between two or more circuit nodes or conductors coupled to said active link, and each active link comprised of enabling circuitry including a memory cell for holding a programming bit that defines whether said active link is enabled or disabled by said enabling circuitry and one or more MOS transistors coupled to an external power supply and arranged to perform a repeater function on the input signal propagating through said active link, each said active link using the transconductance of its one or more transistors and transistor action of at least one or MOS transistors to turn on or turn off said at least one or more MOS transistors in response to the state said input signal thereby causing said external power supply to charge or discharge any parasitic capacitance load coupled to an output of said active link thereby substantially reducing the rise times and fall times of said input signal as it propagates through said active link.

2. The field programmable gate array of claim 1 wherein each said active link has at least one enable input for receiving a programming signal having an enable and disable state, and further comprising one or more MOS transistors coupled to receive said programming signal and respond to said disable state of said enable signal by causing the output of said active link to have a high impedance so that no current can leak from said output back though said active link to said input.

3. The field programmable gate array of claim 1 wherein at least some of said active links are CMOS two-input, one-output NAND gates coupled to memory cells, each NAND gate having one input coupled to said memory cell to receive an enable signal having a logic state defined by the bit stored in said memory cell and having the other input and said output coupled to conductors in said connection matrix so as to programmably connect one line segment to another.

4. The field programmable gate array of claim 1 wherein at least some of said active links comprise NMOS inverters coupled to memory cells.

5. The field programmable gate array of claim 1 wherein at least some of said active links comprise MOS inverters with tri-state output stages, each MOS inverter having an input and an output, said input and output each coupled by enable circuitry to a gate of a totem pole tri-state output stage coupled between high and low voltage conductor rails of said external power supply, each said MOS inverter coupled to said external power supply and said enable circuitry having at least one input for receiving an enable signal.

6. A field programmable gate array, comprising:
a plurality of logic blocks that needs to be connected together in a programmable way to implement a desired function for said field programmable gate array;
a plurality of input/output pins;
a connection matrix coupling said logic blocks together or to said input/output pins in a programmable manner to form a circuit capable of carrying out a desired function specified by a user of said field programmable gate array, said connection matrix characterized by a plurality of conductors coupled to signal inputs and signal outputs of said logic blocks or to said input/output pins and programmably coupled to each other at every one of a plurality of programmable connection sites by programmable active links, each active link being programmable to present either a high impedance path or a low impedance path between two or more circuit nodes or conductors coupled to said active link, and each active link comprised of one or more MOS transistors coupled as an inverter or buffer amplifier driving a totem pole, push-pull tristate output stage having MOS pull-up and pull-down transistors and enabling circuitry including a memory cell for holding a programming bit that defines whether said active link is enabled or disabled by said enabling circuitry, said input and output of said active link being coupled, respectively, to the gates of said pull-up and pull-down transistors through said enabling circuitry, each said active link being coupled to high and low rail conductors of an external power supply, said active link functioning to perform a repeater function on the input signal propagating through said active link to reconstruct said signal by reducing the rise and fall times of pulses in said input signal by turning on or off the MOS pull-up or pull-down transistors of said output stage in response to the logic state said input signal thereby causing said external power supply to charge or discharge any parasitic capacitance load coupled to an output of said active link to simultaneously reproduce said logic transitions of said input signal while reducing the rise times and fall times of said logic transitions as it propagates through said active link when enabled but to present a high impedance to said output when said active link is disabled so as to prevent current from leaking from said output to said input or vice versa and isolating said output from said external power supply.

7. The field programmable gate array of claim 6 wherein said totem pole, push-pull output stage is comprised of devices which are sized so as to produce even rise and fall times in the logic transitions on said output.

8. The field programmable gate array of claim 6 wherein said totem pole, push-pull output stage is comprised of pull-down and pull-up MOS transistors coupled in a ratio-less configuration such that the pull-down transistor turns on while the pull-up device is simultaneously turning off.

9. A process for manufacturing a field programmable gate array connection matrix on the integrated circuit die containing a field programmable gate array, comprising:
forming a connection matrix on said field programmable gate array comprised of a plurality of conductors which are insulated from each other; and
forming a plurality of programmable active links with one or more programmable active links at every location of a programmable connection in said connection matrix so as to selectively couple the signal propagating in a conductor of said connection matrix coupled to an input of said active link to another conductor of said connection matrix coupled to an output of said active link, each active link comprised of an MOS inverter coupled to high and low rail conductors of an external power supply and driving a tristate output stage also coupled to high and low rail conductors of an external power supply and enabling circuitry including a memory call for holding a programming bit that defines whether said active link is enabled or disabled by said enabling circuitry, and having enabling circuitry having an input for receiving an enabling signal having an enable state which causes said active link to operate as a repeater and a disable state which causes said output stage to enter tristate mode so as to isolate said output of said active link from said input and from said external power supply, said active link structured such that, when enabled and acting as a repeater said active link causes said output stage to selectively couple the high or low rail conductors of said external power supply to said output of said active link so as to charge or discharge the parasitic capacitances coupled to said output in response to the logic transitions of said signal propagating in said conductor coupled to said input of said active link thereby causing decreases in the rise times and fall times of logic transitions on said output corresponding to logic transitions on said input.

10. A process for selectively coupling signals from one circuit to another on a field programmable gate array through a connection matrix having a plurality of conductors and a plurality of programmable active links at every programmable connection point in said connection matrix so as to implement a desired functionality for said field programmable gate array, each active link being comprised of one or more transistors connected so as to use transistor action to selectively couple the high and low rail conductors of an external power supply to the output load on said active link and having enabling circuitry including a memory cell to store a programming bit the state of which causes said enabling circuitry to enable or disable said active link, comprising:
generating programming signals suitable to selectively enable the appropriate ones of said active links so as to connect a plurality of said conductors together to form a plurality of data paths through said connection matrix suitable to cause said field programmable gate array to have the desired functionality; and as a signal propagates through each said active link of each said data path, using the transistor action of each active link to selectively couple either said high or low rails of said external power supply to the output of said active link in accordance with the logic transitions of the input signal to said active link thereby reproducing said logic transitions while simultaneously speeding up the rise or fall times thereof.

11. A field programmable gate array, comprising:

a plurality of logic circuits having inputs and outputs;

a connection matrix comprised of horizontal buses, vertical buses, input/output pins and a plurality of programmable connection points that are programmed to be either enabled or disabled so as to define a plurality of data paths through said connection matrix, each comprising an active link, said active links making programmable connections between said inputs and outputs of said logic blocks and individual conductors of said horizontal and vertical buses and between individual conductors of said horizontal and vertical buses and between said individual conductors of said horizontal and vertical buses and said input/output pins;

each said active link comprising an inverting or non inverting transistor amplifier with a tristate output stage coupled to high and low rails of an external power supply and enabling circuitry including a memory cell for holding a programming bit that declines whether said active link is enabled or disabled, each said active link comprised of one or more transistors coupled as a buffer amplifier or inverter coupled to high and low rails of an external power supply so as to use transistor action to selectively couple said high or low rail conductors of said external power supply to said output of said active link in accordance with logic transitions at the input of said active link so as to reproduce said logic transitions on said output while simultaneously decreasing the rise and fall times thereof.

12. The field programmable gate array of claim 11 wherein the connections that define said data paths are made by one or more short range and long range active links.

13. A field programmable gate array, comprising:

a plurality of programmable or nonprogrammable logic circuits, each having input and output conductors;

a plurality of input/output pin conductors;

a connection matrix comprised of a plurality of conductor segments for programmable connection to said logic circuits and said input/output pins and having a plurality buses each comprised of one or more individual conductors and further comprised of a plurality of programmable connection sites each comprised of a programmable active link means, each active link means coupled to the high and low rail conductors of an external power supply and each active link means for programmably connecting an input conductor of said connection matrix to an output conductor of said connection matrix and, when enabled, performing a repeater function by reproducing the logic transitions on said input conductor on said output conductor while simultaneously reducing the rise and fall times thereof by using transistor action to selectively couple said high and low rails of said external power supply to said output conductor, and, when disabled, for isolating said output conductor from said input conductor and from both said high and low rails of said external power supply.

14. A field programmable gate array, comprising:

a plurality of standard cells, logic gates or other circuitry that needs to be connected together in a programmable way to implement a desired function for said field programmable gate array;

a plurality of input/output pins;

a connection matrix coupling said standard cells, logic gates or other circuitry together and to said input/output pins in a programmable manner so as to implement a desired functionality, said connection matrix characterized by a plurality of conductors programmably coupled at a plurality of connection sites to each other or to said input/output pins or to said standard cells, logic gates or other circuitry by a programmable active link means at every connection site, each active link means coupled to high and low rail conductors of an external power supply and comprised solely of MOS type transistors, and each said active link means, when enabled, for performing a repeater function so as to reproduce the logic transitions at an input of said active repeater on an output thereof while simultaneously speeding up the rise and fall times thereof, and, when disabled, for isolating said output from said input and from both said high and low rails of said external power supply.

15. A programmable coupling structure in a field programmable gate array, comprising:

a first segment of a high speed data line in said field programmable gate array;

a second segment of a high speed data line in said field programmable gate array;

one or more active links, each comprised of one or more MOS transistors connected as an inverting or noninverting buffer amplifier with a tristate output stage and enabling circuitry having an enable input for receiving an enable signal and coupled to a memory cell for storing a programming bit which defines the logic state of said enable signal, each having an input coupled to said first segment and an output coupled to said second segment, said active link functioning to couple data signals on said first segment to said second segment while reducing the rise and fall times of logic transitions in said data signals;

and wherein said enabling circuitry comprises one or more MOS steering transistors coupled to said amplifier and tristate output stage in such a way as to render said amplifier and/or output stage inoperative such that no coupling of data signals on said first segment is made to said second segment and such that said second segment is isolated from said first segment and from said high and low rails of said external power supply when said programming bit is in a first logic state and so as to enable said amplifier and output stage so as to couple data signals on said first segment to said second segment and use transistor action to selectively couple said high or low rail conductors of said external power supply to said second conductor to drive any parasitic capacitance or other load coupled therto in accordance with said digital signal on said first conductor so as to decrease the rise and fall times of the digital signals propagating on said second conductor when said programming bit is in a second logic state.

16. A field programmable gate array, comprising:

a plurality of logic blocks that needs to be connected together in a programmable way to implement a desired function for said field programmable gate array;

a plurality of input/output pins;

a connection matrix coupling said logic blocks together or to said input/output pins in a programmable manner to form a circuit capable of carrying out a desired function specified by a user of said field programmable gate array, said connection matrix characterized by a plurality of conductors coupled to signal inputs and signal outputs of said logic blocks or to said input/output pins and programmably coupled to each other at substantially every one of a plurality of programmable connection sites by programmable active links, each active link being programmable by storing a bit in a memory cell coupled to enabling circuitry in said active link to present either a high impedance path or a low impedance path between an input and an output of said active link, and each active link coupled to the high and low rail conductors of an external power supply and structured to selectively couple said high and low rail conductors to said output in accordance with the state of a digital signal on said input such that the signal propagating through said active link has its rise times or fall times reduced;

and wherein each said active link is comprises:
  a differentially coupled buffer amplifier having an output;
  a first emitter follower means coupled between said high and low rail conductors and coupled to said output of said buffer amplifier.

17. A field programmable gate array, comprising:

a plurality of logic blocks that needs to be connected together in a programmable way to implement a desired function for said field programmable gate array;

a plurality of input/output pins;

a connection matrix coupling said logic blocks together or to said input/output pins in a programmable manner to form a circuit capable of carrying out a desired function specified by a user of said field programmable gate array, said connection matrix characterized by a plurality of conductors coupled to signal inputs and signal outputs of said logic blocks or to said input/output pins and programmably coupled to each other at substantially every one of a plurality of programmable connection sites by programmable active links, each active link being programmed to present either a high impedance path or a low impedance path between two or more circuit nodes or conductors coupled to said active link, and each active link structured to amplify the signal propagating through said active link with a gain sufficiently high to substantially reduce the amount of degradation of rise times or fall times in signals propagating through said active links compared to the amount of degradation of rise times or fall times in the same high speed signals propagating through a like number of passive links in the form of pass transistors in prior art field programmable gate arrays;

and wherein each said active link is comprises:
  a high rail conductor and a low rail conductor for coupling to a voltage source for developing a potential difference therebetween;
  first and second data inputs, and first and second data outputs;
  a first emitter follower means coupled between said high and low rail conductors for programmably coupling data signals from said first data input to either, neither or both of said first and second data outputs while applying a gain of approximately one or more to data signals propagating therethrough while providing a desired amount of voltage level shifting of the signal levels propagating therethrough and a desired amount of additional current drive capacity over the current drive capacity of whatever circuit is driving said first data input; and
  a second emitter follower means coupled between said high and low rail conductors for programmably coupling data signals from said second data input to said second data output, provided said first emitter follower means is not simultaneously coupling data signals from said first data input to said second data output, said programmable coupling of said data signals from said second data input to said second data output carried out while applying a gain of approximately one or more to data signals propagating through said second emitter follower means while providing a desired amount of voltage level shifting of the signal levels propagating therethrough and a desired amount of additional current drive capacity over the current drive capacity of whatever circuit is driving said first data input.

* * * * *